(12) United States Patent
Oh et al.

(10) Patent No.: US 11,928,338 B2
(45) Date of Patent: Mar. 12, 2024

(54) METHOD OF MEASURING DURABILITY OF NONVOLATILE MEMORY DEVICE AND METHOD OF PERFORMING WEAR-LEVELING IN STORAGE DEVICE USING THE SAME

(71) Applicant: SAMSUNG ELECTRONICS CO., LTD., Suwon-si (KR)

(72) Inventors: Hyunkyo Oh, Yongin-si (KR); Sanghyun Choi, Seoul (KR); Kangho Roh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 261 days.

(21) Appl. No.: 17/393,643

(22) Filed: Aug. 4, 2021

(65) Prior Publication Data
US 2022/0155971 A1    May 19, 2022

(30) Foreign Application Priority Data

Nov. 13, 2020   (KR) ........................ 10-2020-0151649

(51) Int. Cl.
*G06F 3/06* (2006.01)
(52) U.S. Cl.
CPC .......... *G06F 3/0616* (2013.01); *G06F 3/0653* (2013.01); *G06F 3/0659* (2013.01); *G06F 3/0679* (2013.01); *G06F 2212/7211* (2013.01)
(58) Field of Classification Search
CPC .... G06F 3/0616; G06F 3/0653; G06F 3/0659; G06F 3/0679; G06F 2212/7211
See application file for complete search history.

(56) References Cited

U.S. PATENT DOCUMENTS

| | | | |
|---|---|---|---|
| 7,679,133 B2 | 3/2010 | Son et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 9,329,948 B2 | 5/2016 | Li et al. | |
| 10,079,068 B2 | 9/2018 | Weingarten et al. | |
| 10,268,396 B2 | 4/2019 | Janik | |
| 10,430,112 B2 | 10/2019 | Darragh et al. | |

(Continued)

OTHER PUBLICATIONS

Luo, Yixin, et al. "HeatWatch: Improving 3D Nand flash memory device reliability by exploiting self-recovery and temperature awareness." 2018 IEEE International Symposium on High Performance Computer Architecture (HPCA). IEEE, 2018. (Year: 2018).*

(Continued)

*Primary Examiner* — Nicholas J Simonetti
(74) *Attorney, Agent, or Firm* — Fish & Richardson P.C.

(57) ABSTRACT

A method of measuring durability of a nonvolatile memory device that includes a plurality of memory blocks, the method including: periodically receiving a read command for a first memory block among the plurality of memory blocks; periodically performing a read operation on the first memory block based on the read command; periodically outputting at least one cell count value associated with the first memory block based on a result of the read operation; and periodically storing durability information associated with the first memory block in response to a periodic reception of the durability information, the durability information being obtained by accumulating the at least one cell count value.

20 Claims, 23 Drawing Sheets

(56) References Cited

U.S. PATENT DOCUMENTS

| | | | |
|---|---|---|---|
| 10,713,155 B2 | 7/2020 | Tai et al. | |
| 10,713,159 B2 | 7/2020 | Jung et al. | |
| 2011/0066899 A1* | 3/2011 | Kang | G06F 12/0246 |
| | | | 711/E12.001 |
| 2011/0233648 A1 | 9/2011 | Seol et al. | |
| 2015/0262694 A1* | 9/2015 | Seo | G11C 11/5642 |
| | | | 365/185.11 |
| 2016/0372208 A1* | 12/2016 | Cai | G06F 11/076 |
| 2018/0067697 A1* | 3/2018 | Lee | G06F 3/0619 |
| 2019/0147964 A1* | 5/2019 | Yun | G11C 16/3459 |
| | | | 365/185.22 |
| 2019/0164618 A1* | 5/2019 | Yun | G11C 16/3486 |
| 2020/0225850 A1 | 7/2020 | Rastogi et al. | |
| 2021/0241845 A1* | 8/2021 | Li | G11C 11/54 |

OTHER PUBLICATIONS

Cai, Yu, et al. "Error patterns in MLC NAND flash memory: Measurement, characterization, and analysis." 2012 Design, Automation & Test in Europe Conference & Exhibition (Date). IEEE, 2012. (Year: 2012).*

\* cited by examiner

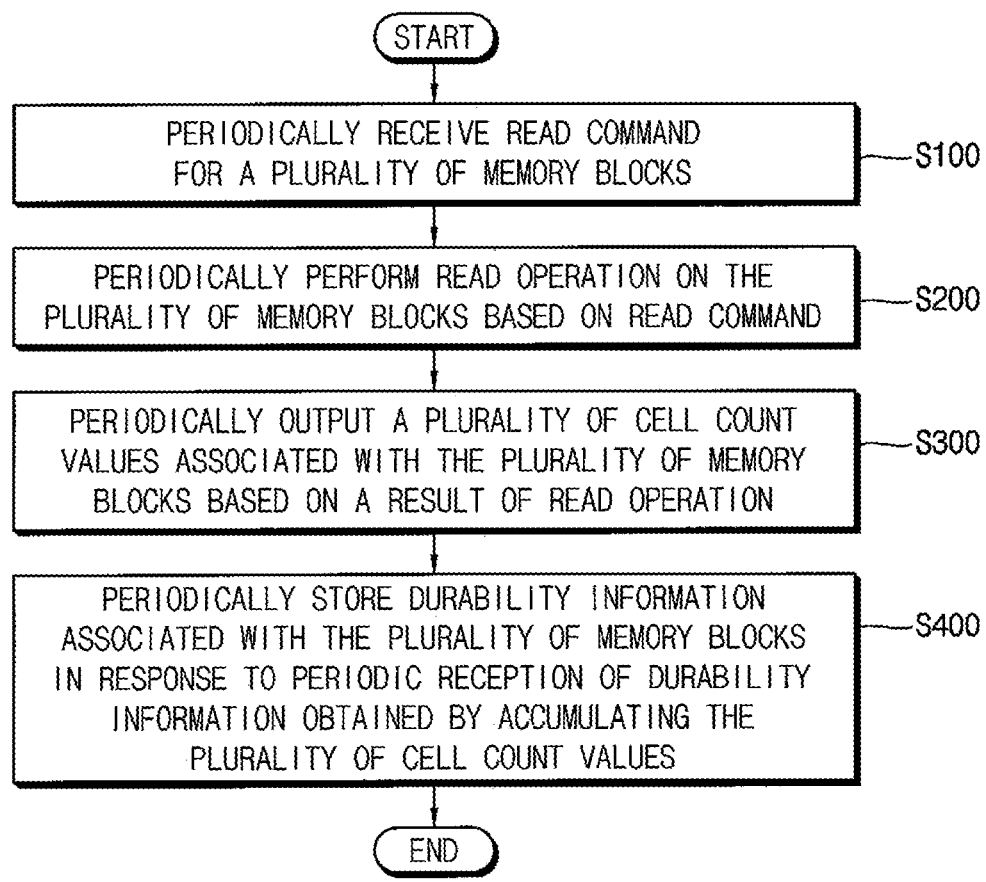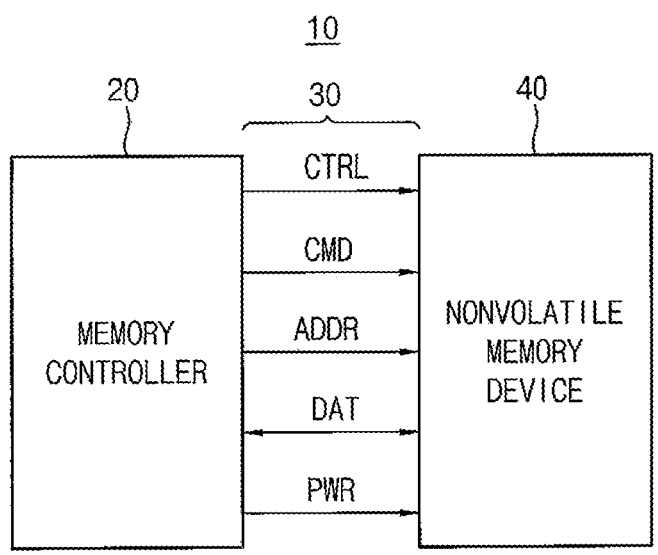

BLKi

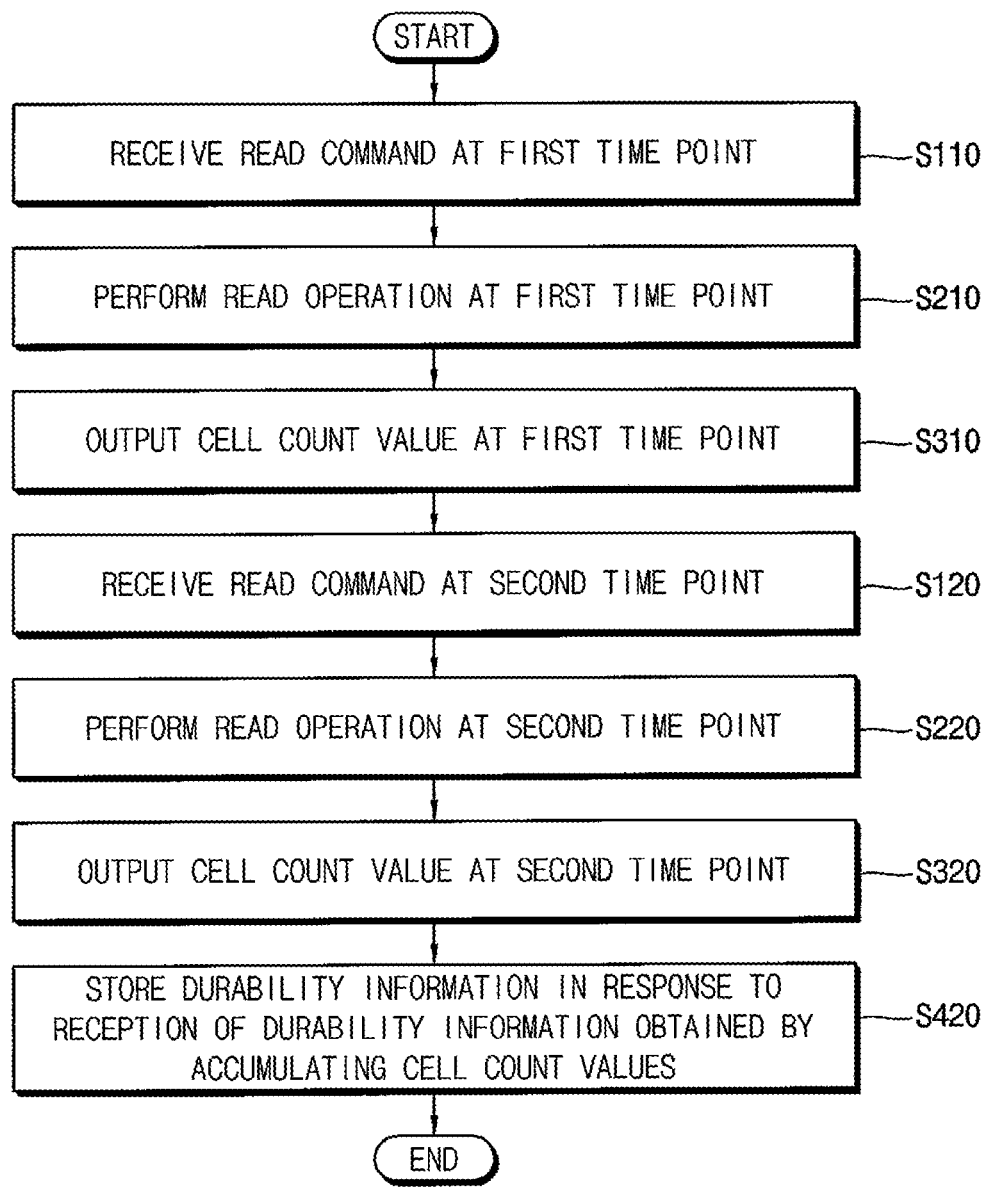

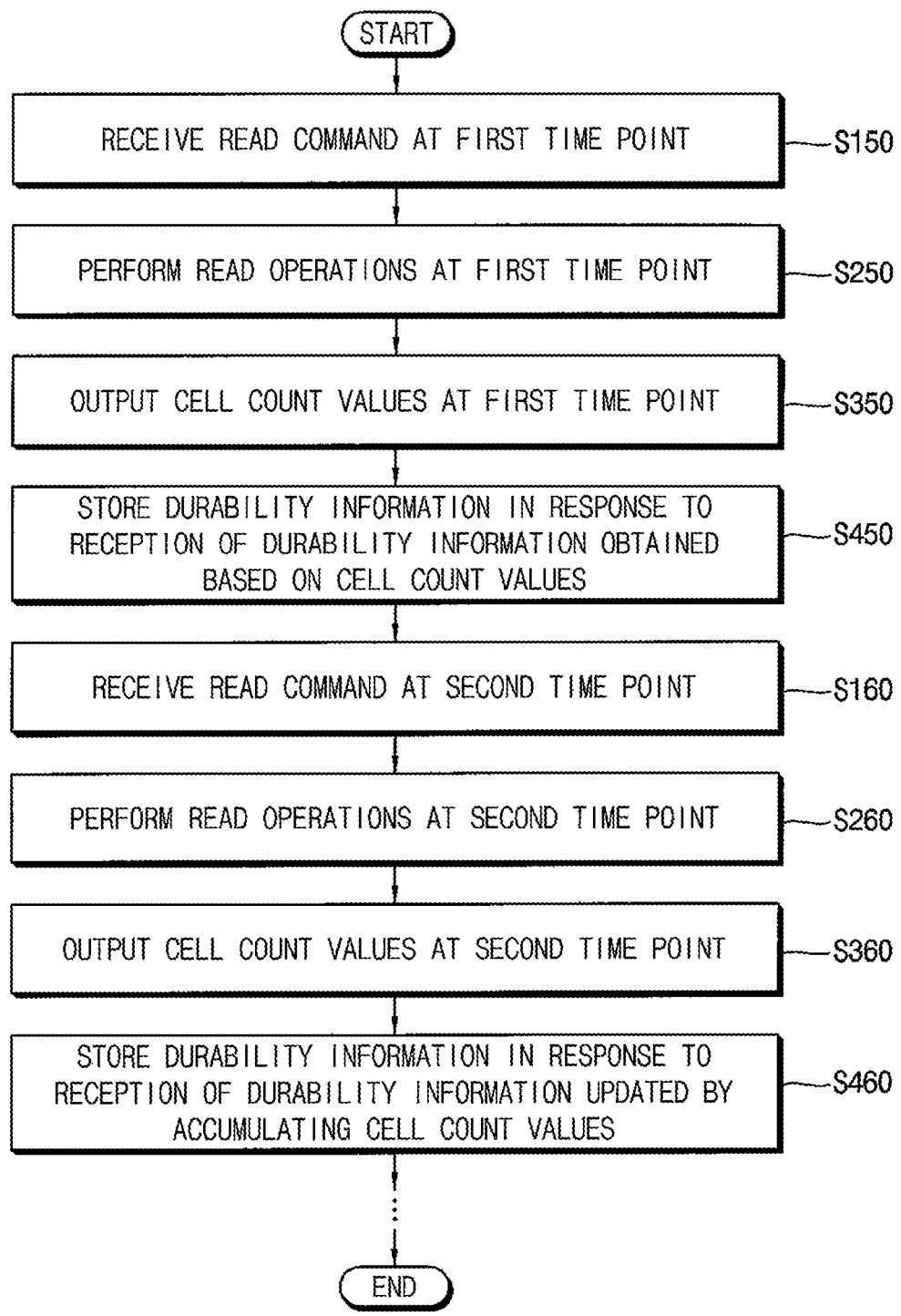

METHOD OF MEASURING DURABILITY OF NONVOLATILE MEMORY DEVICE AND METHOD OF PERFORMING WEAR-LEVELING IN STORAGE DEVICE USING THE SAME

CROSS-REFERENCE TO RELATED APPLICATION

Korean Patent Application No. 10-2020-0151649 filed on Nov. 13, 2020 in the Korean Intellectual Property Office, and entitled: "Method of Measuring Durability of Nonvolatile Memory Device and Method of Performing Wear-Leveling in Storage Device Using the Same," is incorporated by reference herein in its entirety.

BACKGROUND

1. Field

Example embodiments relate generally to semiconductor integrated circuits, and more particularly to methods of measuring durability of nonvolatile memory devices, and methods of performing wear-leveling in storage devices using the methods of measuring durability of the nonvolatile memory devices.

2. Description of the Related Art

Certain types of data storage devices include one or more semiconductor memory devices. Examples of such data storage devices include solid state drives (SSDs). These types of data storage devices may have various design and/or performance advantages over hard disk drives (HDDs). Examples of potential advantages include the absence of moving mechanical parts, higher data access speeds, stability, durability, and/or low power consumption. Recently, various systems, e.g., a laptop computer, a car, an airplane, a drone, etc., have adopted the SSDs for data storage.

SUMMARY

Embodiments are directed to a method of measuring durability of a nonvolatile memory device that includes a plurality of memory blocks, the method including: periodically receiving a read command for a first memory block among the plurality of memory blocks; periodically performing a read operation on the first memory block based on the read command; periodically outputting at least one cell count value associated with the first memory block based on a result of the read operation; and periodically storing durability information associated with the first memory block in response to a periodic reception of the durability information, the durability information being obtained by accumulating the at least one cell count value.

Embodiments are also directed to a method of performing wear-leveling in a storage device that includes a storage controller and a plurality of nonvolatile memory devices, each of the plurality of nonvolatile memory devices including a plurality of memory blocks, the method including: periodically obtaining durability information associated with a first memory block among the plurality of memory blocks by periodically obtaining at least one cell count value associated with the first memory block; and moving first data stored in the first memory block to a second memory block based on the durability information. Periodically obtaining the durability information may include: periodically providing, by the storage controller, a read command for the first memory block; periodically performing a read operation on the first memory block based on the read command; periodically providing, by the plurality of nonvolatile memory devices, the at least one cell count value based on a result of the read operation; and periodically providing, by the storage controller, the durability information, the durability information being obtained by accumulating the at least one cell count value.

Embodiments are also directed to a method of measuring durability of a nonvolatile memory device that includes a plurality of memory blocks, the method including: at a first time point, receiving a first read command for a first memory block among the plurality of memory blocks; at the first time point, performing a first read operation on first memory cells among a plurality of memory cells included in the first memory block based on a first read voltage; at the first time point, generating a first cell count value associated with the first memory cells based on a result of the first read operation to output the first cell count value; at a second time point at which a first time interval is elapsed from the first time point, receiving a second read command for the first memory block; at the second time point, performing a second read operation on the first memory cells based on the first read voltage; at the second time point, generating a second cell count value associated with the first memory cells based on a result of the second read operation to output the second cell count value; obtaining a first durability value associated with the first memory block based on the first cell count value and the second cell count value; and storing the first durability value in response to a reception of the first durability value. The first durability value may correspond to a change in a number of on-cells among the first memory cells, and the on-cells may represent memory cells having a threshold voltage lower than the first read voltage among the first memory cells

BRIEF DESCRIPTION OF THE DRAWINGS

Features will become apparent to those of skill in the art by describing in detail example embodiments with reference to the attached drawings in which:

FIG. 1 is a flowchart illustrating a method of measuring durability of a nonvolatile memory device according to example embodiments.

FIG. 2 is a block diagram illustrating a memory system according to example embodiments.

FIG. 7 is a flowchart illustrating an example of a method of measuring durability of a nonvolatile memory device of FIG. 1.

FIG. 15 is a flowchart illustrating still another example of a method of measuring durability of a nonvolatile memory device of FIG. 1.

DETAILED DESCRIPTION

Figure 3:
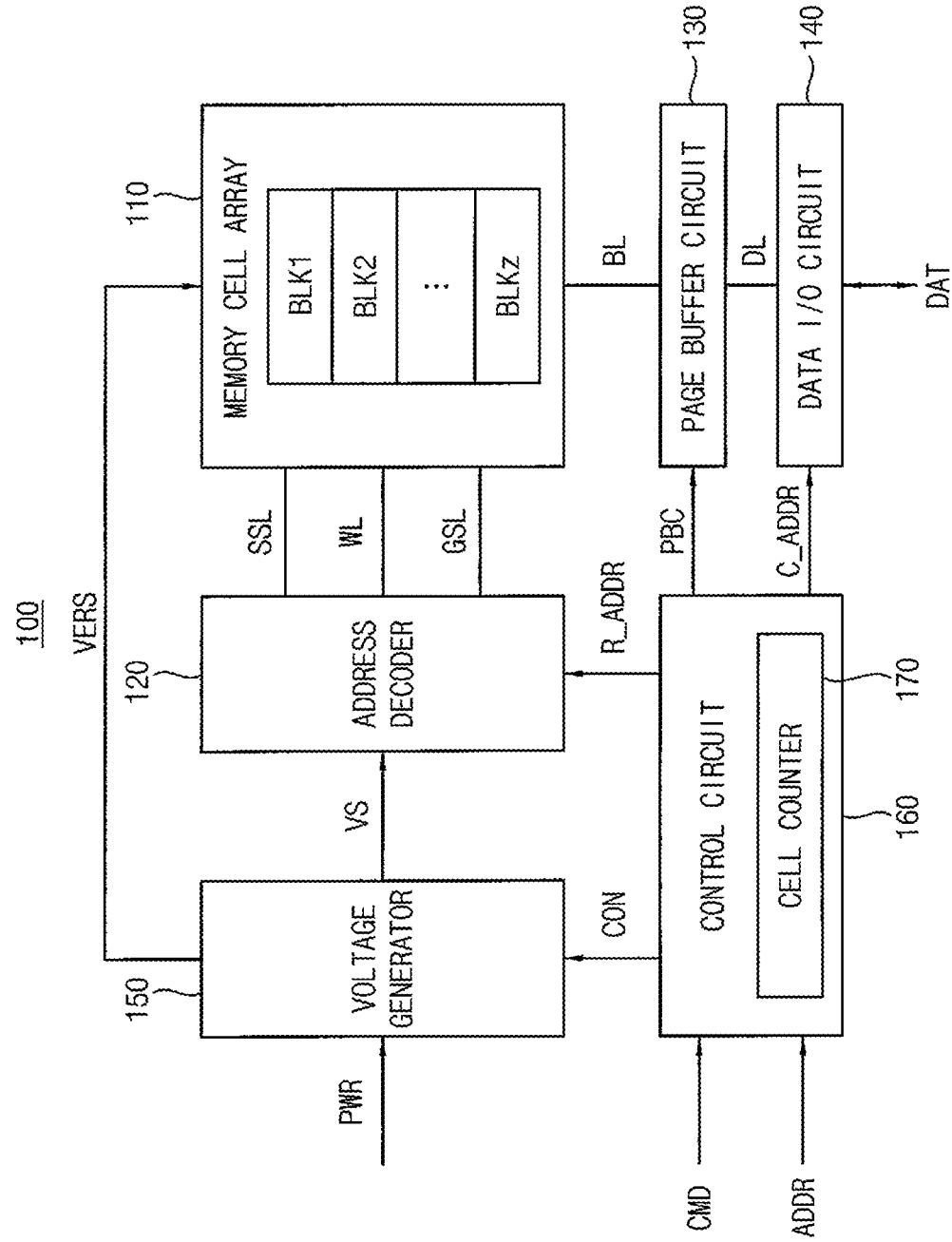
FIG. 3 is a block diagram illustrating a nonvolatile memory device according to example embodiments.

FIG. 1 is a flowchart illustrating a method of measuring durability of a nonvolatile memory device according to example embodiments.

Referring to FIG. 1, a method of measuring durability of a nonvolatile memory device according to example embodiments may be performed by a nonvolatile memory device that includes a plurality of memory blocks. Detailed configurations of the nonvolatile memory device and a memory system including the nonvolatile memory device will be described further with reference to FIGS. 2 through 6.

In the method of measuring durability of the nonvolatile memory device according to the present example embodiment, a read command for the plurality of memory blocks may be periodically received (operation S100). For example, a read command for a first memory block among the plurality of memory blocks may be periodically received. For example, the read command may be received from a memory controller that is located outside the nonvolatile memory device, and may be regularly received (e.g., received every first time interval).

A read operation may be periodically performed on the plurality of memory blocks based on the read command (operation S200). For example, a read operation may be periodically performed on the first memory block. For example, the read operation may be performed on all of the plurality of memory blocks at the same time point. In addition, the read operation may be performed on a part or some of memory cells included in each memory block, and may be regularly performed (e.g., performed every first time interval).

A plurality of cell count values associated with the plurality of memory blocks may be periodically output based on a result of the read operation (operation S300). For example, at least one cell count value associated with the first memory block may be periodically output. For example, the plurality of cell count values associated with the plurality of memory blocks may be generated and output at the same time point, and at least one cell count value associated with each memory block may be generated and output. A cell count operation for generating the cell count value may be internally performed by the nonvolatile memory device, and may be performed based on a distribution of threshold voltages of the memory cells. The cell count operation may be referred to as a mass bit count operation.

Durability information associated with the plurality of memory blocks may be periodically stored in response to a periodic reception of the durability information obtained by accumulating the plurality of cell count values (operation S400). For example, durability information associated with the first memory block may be periodically stored in response to a periodic reception of the durability information obtained by accumulating the at least one cell count value. For example, the durability information may include a plurality of durability values associated with the plurality of memory blocks, and each memory block may have one durability value. Each durability value may be obtained by the memory controller, and may be regularly generated, updated, and provided (e.g., generated, updated, and provided every first time interval). For example, the durability value may correspond to a change in the cell count values.

In the method of measuring durability of the nonvolatile memory device according to the present example embodiment, the cell count values associated with each memory block may be periodically obtained, and the durability value associated with each memory block may be generated by accumulating the cell count values. As compared to a durability value based on program/erase (P/E) cycles, the durability value based on the cell count values according to the present example embodiment may be obtained with a relatively low cost, and the durability of each memory block may be precisely and/or accurately represented by the durability value based on the cell count values. Accordingly, the durability and/or wear-level of the plurality of memory blocks may be efficiently checked, and thus the plurality of memory blocks may be efficiently managed.

FIG. 2 is a block diagram illustrating a memory system according to example embodiments.

Referring to FIG. 2, a memory system 10 may include a memory controller 20 and a nonvolatile memory device 40. The memory system 10 may include a plurality of signal lines 30 that electrically connect the memory controller 20 with the nonvolatile memory device 40.

The nonvolatile memory device 40 may be controlled by the memory controller 20. For example, based on requests from a host device (e.g., a host device 600 in FIG. 22), the memory controller 20 may store (e.g., write or program) data into the nonvolatile memory device 40, or may retrieve (e.g., read or sense) data from the nonvolatile memory device 40.

The plurality of signal lines 30 may include control lines, command lines, address lines, data input/output (I/O) lines, and power lines. The memory controller 20 may transmit a command CMD, an address ADDR, and a control signal CTRL to the nonvolatile memory device 40 via the command lines, the address lines, and the control lines. The memory controller 20 may exchange a data signal DAT with the nonvolatile memory device 40 via the data I/O lines. The memory controller 20 may transmit a power supply voltage PWR to the nonvolatile memory device 40 via the power lines. Although not illustrated in FIG. 2, the plurality of signal lines 30 may include data strobe signal (DQS) lines for transmitting a DQS signal. In an example embodiment, at least a part or all of the plurality of signal lines 30 may be referred to as a channel.

FIG. 3 is a block diagram illustrating a nonvolatile memory device according to example embodiments.

Referring to FIG. 3, a nonvolatile memory device 100 may include a memory cell array 110, an address decoder 120, a page buffer circuit 130, a data input/output (I/O) circuit 140, a voltage generator 150, and a control circuit 160.

The memory cell array 110 may be connected to the address decoder 120 via a plurality of string selection lines SSL, a plurality of wordlines WL, and a plurality of ground selection lines GSL. The memory cell array 110 may be connected to the page buffer circuit 130 via a plurality of bitlines BL. The memory cell array 110 may include a plurality of memory cells (e.g., a plurality of nonvolatile memory cells) that are connected to the plurality of wordlines WL and the plurality of bitlines BL. The memory cell array 110 may be divided into a plurality of memory blocks BLK1, BLK2, ..., BLKz, each of which includes memory cells. In addition, each of the plurality of memory blocks BLK1, BLK2, ..., BLKz may be divided into a plurality of pages.

In an example embodiment, as will be described further with reference to FIGS. 4 and 5, the memory cell array 110 may be a three-dimensional (3D) memory cell array that is formed on a substrate in a three-dimensional structure (or a vertical structure). In this example embodiment, the memory cell array 110 may include a plurality of cell strings (e.g., a plurality of vertical NAND strings) that are vertically oriented such that at least one memory cell is located over another memory cell.

The control circuit 160 may receive a command CMD and an address ADDR from outside (e.g., from a memory controller), and may control erasure, programming, and read operations of the nonvolatile memory device 100 based on the command CMD and the address ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

In an example embodiment, the control circuit 160 may generate control signals CON for controlling the voltage generator 150, may generate control signal PBC for controlling the page buffer circuit 130, based on the command CMD, and may generate a row address R_ADDR and a column address C_ADDR based on the address ADDR. The control circuit 160 may provide the row address R_ADDR to the address decoder 120, and may provide the column address C_ADDR to the data I/O circuit 140.

The control circuit 160 may include a cell counter 170 that is used to perform the method of measuring durability of the nonvolatile memory device according to example embodiments described with reference to FIG. 1. For example, the cell counter 170 may perform an operation of periodically generating and outputting the plurality of cell count values in operation S300 of FIG. 1. The cell counter 170 may be referred to as a mass bit counter (MBC). In an example embodiment, the cell counter 170 may be disposed or located outside the control circuit 160.

If the nonvolatile memory device 100 is a NAND flash memory device and the plurality of memory cells included in the memory cell array 110 are NAND flash memory cells, each memory cell may include a charge storage layer (or a charge trapping layer). Each memory cell may have a first state or a second state depending on the number of charges stored in the charge storage layer. For example, when the number of charges stored in the charge storage layer is greater than a reference number (e.g., when a sufficient number of charges are stored in the charge storage layer), each memory cell may have the first state, and a current that is less than a reference current may flow through each memory cell. When the number of charges stored in the charge storage layer is less than or equal to the reference number (e.g., when no charges are stored in the charge storage layer), each memory cell may have the second state, and a current that is greater than or equal to the reference current may flow through each memory cell. The memory cell having the first state may be referred to as an upper state cell or an off-cell, and the memory cell having the second state may be referred to as a lower state cell or an on-cell. The number of on-cells may be obtained based on sensing currents obtained from the plurality of memory cells (e.g., by performing an analog-to-digital conversion on the sensing currents). Since a relatively large number of memory cells may be counted by performing a single sensing operation, such operation may be referred to as a mass bit counting operation.

The address decoder 120 may be connected to the memory cell array 110 via the plurality of string selection lines SSL, the plurality of wordlines WL, and the plurality of ground selection lines GSL.

For example, in the data erase/write/read operations, the address decoder 120 may determine at least one of the plurality of wordlines WL as a selected wordline, and may determine the rest or remainder of the plurality of wordlines WL other than the selected wordline as unselected wordlines, based on the row address R_ADDR.

In addition, in the data erase/write/read operations, the address decoder 120 may determine at least one of the plurality of string selection lines SSL as a selected string selection line, and may determine the rest or remainder of the plurality of string selection lines SSL other than the selected string selection line as unselected string selection lines, based on the row address R_ADDR.

Further, in the data erase/write/read operations, the address decoder 120 may determine at least one of the plurality of ground selection lines GSL as a selected ground selection line, and may determine the rest or remainder of the plurality of ground selection lines GSL other than the selected ground selection line as unselected ground selection lines, based on the row address R_ADDR.

The voltage generator 150 may generate voltages VS that are used for an operation of the nonvolatile memory device 100 based on a power PWR and the control signals CON. The voltages VS may be applied to the plurality of string selection lines SSL, the plurality of wordlines WL, and the plurality of ground selection lines GSL via the address decoder 120. In addition, the voltage generator 150 may generate an erase voltage VERS that is used for the data erase operation based on the power PWR and the control signals CON. The erase voltage VERS may be applied to the memory cell array 110 directly or via the plurality of bitlines BL.

For example, during the erase operation, the voltage generator 150 may apply the erase voltage VERS to a common source line and/or a bitline BL of a memory block (e.g., a selected memory block), and may apply an erase permission voltage (e.g., a ground voltage) to all wordlines of the memory block or a portion of the wordlines via the address decoder 120. In addition, during the erase verification operation, the voltage generator 150 may apply an erase verification voltage simultaneously to all wordlines of the memory block, or sequentially to the wordlines one by one.

For example, during the program operation, the voltage generator 150 may apply a program voltage to the selected wordline, and may apply a program pass voltage to the unselected wordlines via the address decoder 120. In addition, during the program verification operation, the voltage generator 150 may apply a program verification voltage to the selected wordline, and may apply a verification pass voltage to the unselected wordlines via the address decoder 120.

In addition, during the normal read operation, the voltage generator 150 may apply a read voltage to the selected wordline, and may apply a read pass voltage to the unselected wordlines via the address decoder 120. During the data recover read operation, the voltage generator 150 may apply the read voltage to a wordline adjacent to the selected wordline, and may apply a recover read voltage to the selected wordline via the address decoder 120.

The page buffer circuit 130 may be connected to the memory cell array 110 via the plurality of bitlines BL. The page buffer circuit 130 may include a plurality of page buffers. In an example embodiment, each page buffer may be connected to one bitline. In other example embodiments, each page buffer may be connected to two or more bitlines.

The page buffer circuit 130 may store data DAT to be programmed into the memory cell array 110 or may read data DAT sensed from the memory cell array 110. Thus, the page buffer circuit 130 may operate as a write driver or a sensing amplifier according to an operation mode of the nonvolatile memory device 100.

The data I/O circuit 140 may be connected to the page buffer circuit 130 via data lines DL. The data I/O circuit 140 may provide the data DAT from the outside of the nonvolatile memory device 100 to the memory cell array 110 via the page buffer circuit 130, or may provide the data DAT from the memory cell array 110 to the outside of the nonvolatile memory device 100, based on the column address C_ADDR.

Figure 4:
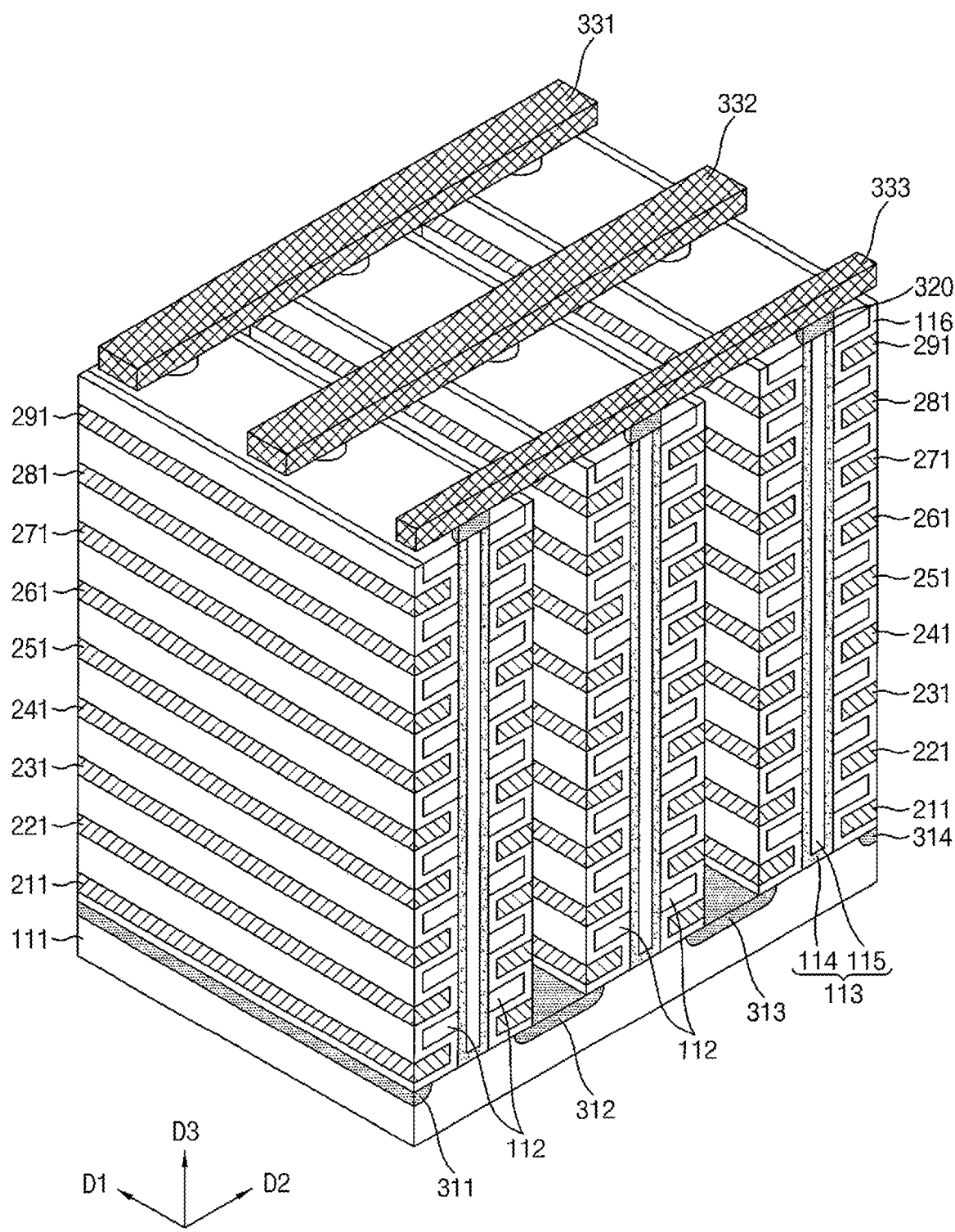
FIG. 4 is a perspective view of an example of a memory block included in a memory cell array included in a nonvolatile memory device of FIG. 3.

FIG. 4 is a perspective view of an example of a memory block included in a memory cell array included in a nonvolatile memory device of FIG. 3.

Referring to FIG. 4, a memory block BLKi may include a plurality of cell strings (e.g., a plurality of vertical NAND strings) that are formed on a substrate in a three-dimensional structure (or a vertical structure). The memory block BLKi may include structures extending along first, second, and third directions D1, D2, and D3.

A substrate 111 may have a well of a first type of charge carrier impurity (e.g., a first conductivity type) therein. For example, the substrate 111 may have a p-well formed by implanting a group 3 element such as boron (B). In particular, the substrate 111 may have a pocket p-well provided within an n-well. In an example embodiment, the substrate 111 has a p-type well (or a p-type pocket well). However, the conductive type of the substrate 111 is not limited to p-type.

A plurality of doping regions 311, 312, 313, and 314, arranged along the second direction D2, may be provided in/on the substrate 111. The plurality of doping regions 311 to 314 may have a second type of charge carrier impurity (e.g., a second conductivity type) different from the first type of the substrate 111. In an example embodiment, the first to fourth doping regions 311 to 314 may have n-type. However, the conductive type of the first to fourth doping regions 311 to 314 is not limited to n-type.

A plurality of insulation materials 112, extending along the first direction D1, may be sequentially provided along the third direction D3 on a region of the substrate 111 between the first and second doping regions 311 and 312. For example, the plurality of insulation materials 112 may be provided along the third direction D3, being spaced by a specific distance. For example, the insulation materials 112 may include an insulation material such as an oxide layer.

A plurality of pillars 113, penetrating the insulation materials along the third direction D3, may be sequentially disposed along the first direction D1 on a region of the substrate 111 between the first and second doping regions 311 and 312. For example, the plurality of pillars 113 may penetrate the insulation materials 112 to contact the substrate 111.

In an example embodiment, each pillar 113 may include a plurality of materials. For example, a channel layer 114 of each pillar 113 may include a silicon material having a first conductivity type. For example, the channel layer 114 of each pillar 113 may include a silicon material having the same conductivity type as the substrate 111. In an example embodiment, the channel layer 114 of each pillar 113 includes p-type silicon. However, the channel layer 114 of each pillar 113 is not limited to the p-type silicon.

An internal material 115 of each pillar 113 may include an insulation material. For example, the internal material 115 of each pillar 113 may include an insulation material such as a silicon oxide. In an example embodiment, the internal material 115 of each pillar 113 may include an air gap. The term "air," as described herein, may refer to atmospheric air, or other gases that may be present during the manufacturing process.

An insulation layer 116 may be provided along the exposed surfaces of the insulation materials 112, the pillars 113, and the substrate 111, on a region between the first and second doping regions 311 and 312. For example, the insulation layer 116 provided on surfaces of the insulation material 112 may be interposed between pillars 113 and a plurality of stacked first conductive materials 211, 221, 231, 241, 251, 261, 271, 281, and 291. In an example embodiment, the insulation layer 116 may not be provided between the first conductive materials 211 to 291 corresponding to ground selection lines GSL (e.g., 211) and string selection lines SSL (e.g., 291). In this example embodiment, the ground selection lines GSL are the lowermost ones of the stack of first conductive materials 211 to 291 and the string selection lines SSL are the uppermost ones of the stack of first conductive materials 211 to 291.

The plurality of first conductive materials 211 to 291 may be provided on surfaces of the insulation layer 116, in a region between the first and second doping regions 311 and 312. For example, the first conductive material 211 extending along the first direction D1 may be provided between the insulation material 112 adjacent to the substrate 111 and the substrate 111. For example, the first conductive material 211, extending along the first direction D1, may be provided between the substrate 111 and the insulation layer 116 at the bottom of the insulation material 112 adjacent to the substrate 111.

A first conductive material, extending along the first direction D1, may be provided between the insulation layer 116 at the top of the specific insulation material among the insulation materials 112 and the insulation layer 116 at the bottom of a specific insulation material among the insulation materials 112. For example, a plurality of first conductive materials 221 to 281 extending along the first direction D1 may be provided between the insulation materials 112, and it may be understood that the insulation layer 116 is provided between the insulation materials 112 and the first conductive materials 221 to 281. The first conductive materials 211 to 291 may be formed of a conductive metal, but in other example embodiments the first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, a plurality of insulation materials 112 may be provided, which extend along the first direction D1. In addition, a plurality of pillars 113 may be provided that are disposed sequentially along the first direction D1 and penetrate the plurality of insulation materials 112 along the third direction D3. An insulation layer 116 may be provided on the exposed surfaces of the plurality of insulation materials 112 and the plurality of pillars 113, and a plurality of first conductive materials 211 to 291 may extend along the first direction D1. Similarly, the same structures as those on the first and second doping regions 311 and 312 may be provided in a region between the third and fourth doping regions 313 and 314.

A plurality of drain regions 320 may be provided on the plurality of pillars 113, respectively. The drain regions 320 may include silicon materials doped with a second type of charge carrier impurity. For example, the drain regions 320 may include silicon materials doped with an n-type dopant. In an example embodiment, the drain regions 320 include n-type silicon materials. However, the drain regions 320 are not limited to n-type silicon materials.

On the drain regions, a plurality of second conductive materials 331, 332, and 333 may be provided, which extend along the second direction D2. The second conductive materials 331 to 333 may be disposed along the first direction D1, while being spaced apart from each other by a specific distance. The second conductive materials 331 to 333 may be respectively connected to the drain regions 320 in a corresponding region. The drain regions 320 and the second conductive material 333 extending along the second direction D2 may be connected through each contact plug. Each contact plug may be, for example, a conductive plug formed of a conductive material such as a metal. The second conductive materials 331 to 333 may include metal materials. The second conductive materials 331 to 333 may include conductive materials such as a polysilicon.

In an example embodiment corresponding to FIG. 4, the first conductive materials 211 to 291 may be used to form the wordlines WL, the string selection lines SSL, and the ground selection lines GSL. For example, the first conductive materials 221 to 281 may be used to form the wordlines WL, where conductive materials belonging to the same layer may be interconnected. The second conductive materials 331 to 333 may be used to form the bitlines BL. The number of layers of the first conductive materials 211 to 291 may be changed variously according to process and control techniques.

Figure 5:
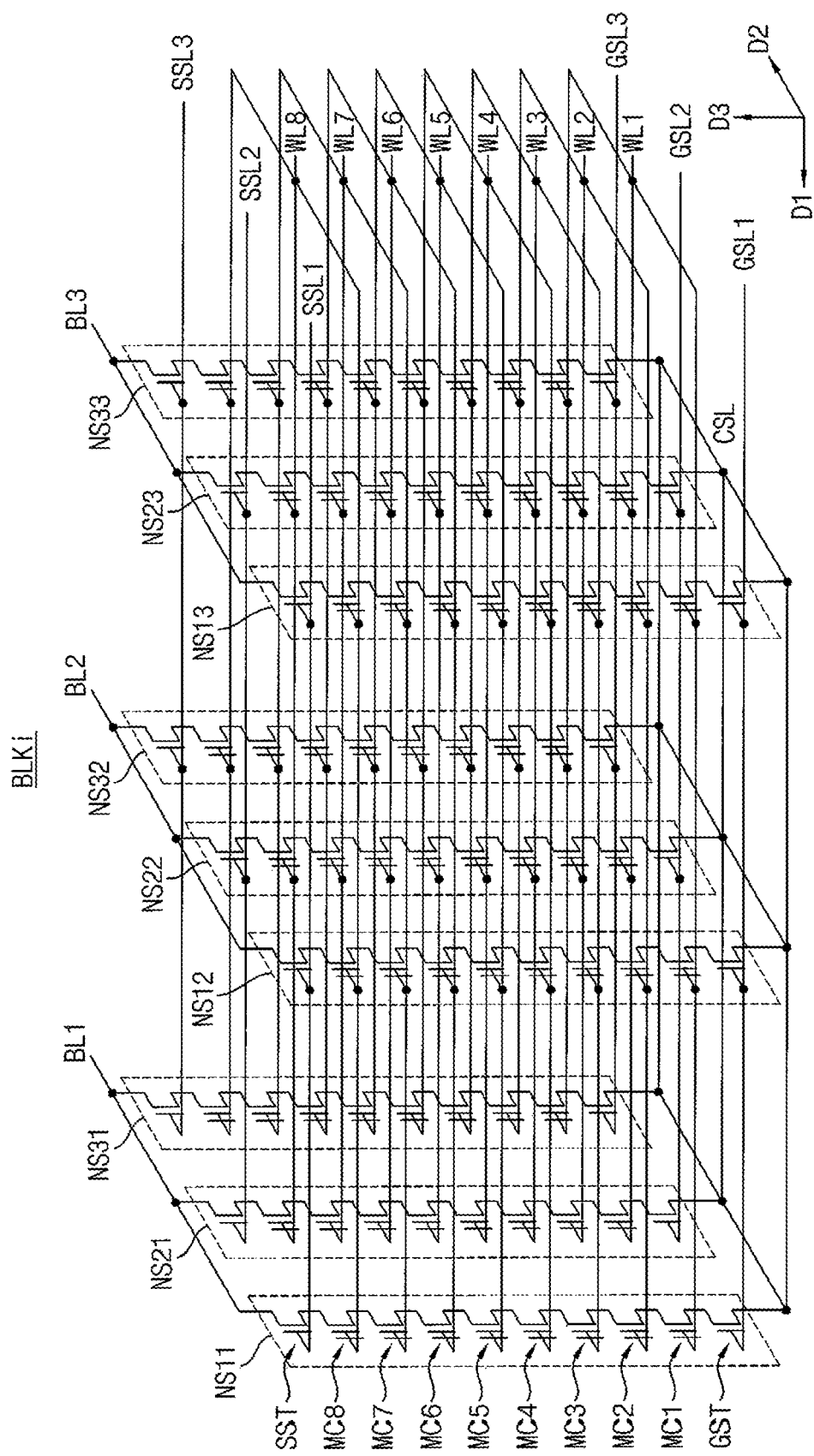
FIG. 5 is a circuit diagram illustrating an equivalent circuit of a memory block described with reference to FIG. 4.

FIG. 5 is a circuit diagram illustrating an equivalent circuit of a memory block described with reference to FIG. 4.

A memory block BLKi of FIG. 5 may be formed on a substrate in a three-dimensional structure (or a vertical structure). For example, a plurality of NAND strings included in the memory block BLKi may be formed in a direction perpendicular to the substrate.

Referring to FIG. 5, the memory block BLKi may include a plurality of NAND strings NS11, NS12, NS13, NS21, NS22, NS23, NS31, NS32, and NS33 connected between bitlines BL1, BL2, and BL3 and a common source line CSL. Each of the NAND strings NS11 to NS33 may include a string selection transistor SST, a plurality of memory cells MC1, MC2, MC3, MC4, MC5, MC6, MC7, and MC8, and a ground selection transistor GST. For example, the bitlines BL1 to BL3 may correspond to the second conductive materials 331 to 333 in FIG. 4, and the common source line CSL may be formed by interconnecting the first to fourth doping regions 311 to 314 in FIG. 4.

Each string selection transistor SST may be connected to a corresponding string selection line (one of SSL1, SSL2, and SSL3). The plurality of memory cells MC1 to MC8 may be connected to corresponding wordlines WL1, WL2, WL3, WL4, WL5, WL6, WL7, and WL8, respectively. Each ground selection transistor GST may be connected to a corresponding ground selection line (one of GSL1, GSL2, and GSL3). Each string selection transistor SST may be connected to a corresponding bitline (e.g., one of BL1 to BL3), and each ground selection transistor GST may be connected to the common source line CSL. In an example embodiment corresponding to FIG. 5, some of the string selection transistors SST may be connected to the same bitline (e.g., one of BL1 to BL3) to connect corresponding NAND strings to the same bitline up appropriate selection via selection voltages applied to the appropriate sting selection lines SSL1 to SSL3 and ground selection lines GSL1 to GSL3.

The cell strings connected in common to one bitline may form one column, and the cell strings connected to one string selection line may form one row. For example, the cell strings NS11, NS21 and NS31 connected to the first bitline BL1 may correspond to a first column, and the cell strings NS11, NS12 and NS13 connected to the first string selection line SSL1 may form a first row.

Wordlines (e.g., WL1) having the same height may be commonly connected, and the ground selection lines GSL1 to GSL3 and the string selection lines SSL1 to SSL3 may be separated. Memory cells located at the same semiconductor layer may share a wordline. Cell strings in the same row may share a string selection line. The common source line CSL may be connected in common to all of cell strings.

In FIG. 5, the memory block BLKi is illustrated as being connected to eight wordlines WL1 to WL8 and three bitlines BL1 to BL3, and each of the NAND strings NS11 to NS33 is illustrated as including eight memory cells MC1 to MC8. However, example embodiments are not limited thereto. In an example embodiment, each memory block may be connected to any number of wordlines and bitlines, and each NAND string may include any number of memory cells.

A three-dimensional vertical array structure may include vertical NAND strings that are vertically oriented such that at least one memory cell is located over another memory cell. The at least one memory cell may include a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

Although the memory cell array included in the nonvolatile memory device according to example embodiments may be described based on a NAND flash memory device, the nonvolatile memory device according to example embodiments may be any nonvolatile memory device, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), or the like.

Figure 6:
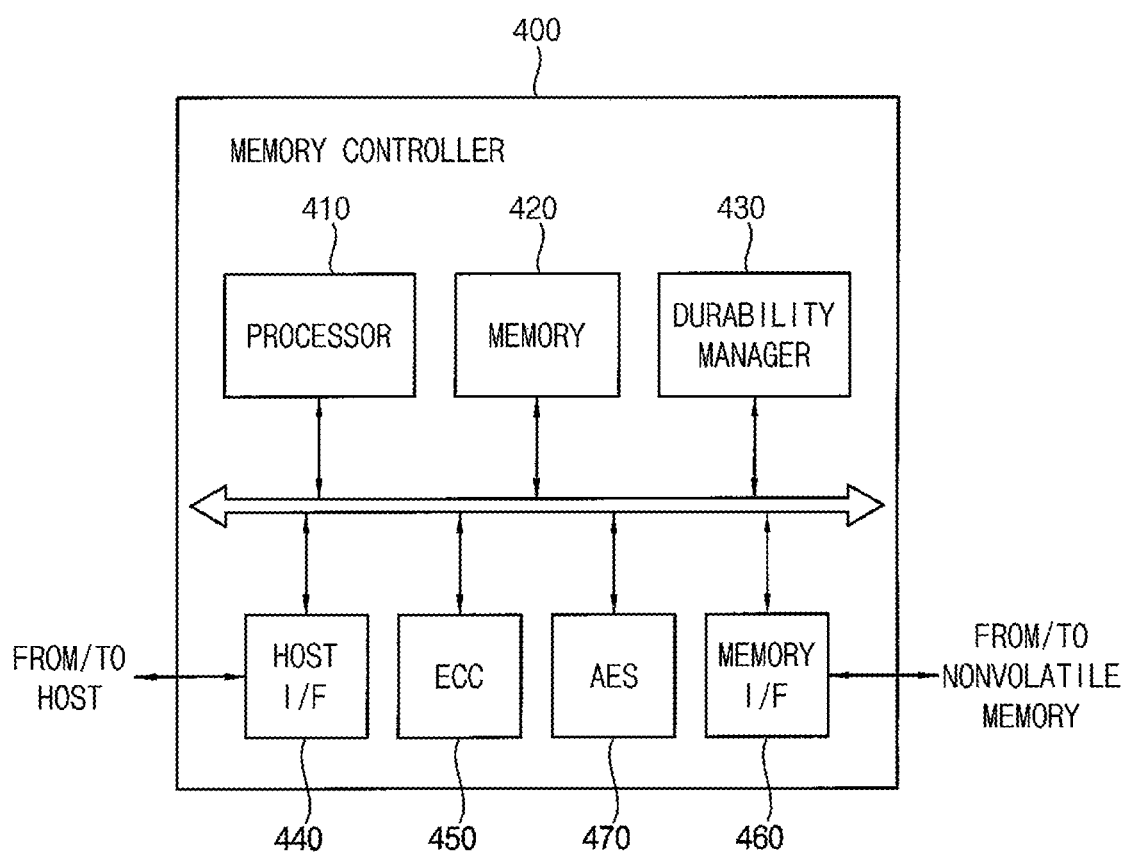
FIG. 6 is a block diagram illustrating an example of a memory controller included in a memory system according to example embodiments.

FIG. 6 is a block diagram illustrating an example of a memory controller included in a memory system according to example embodiments.

Referring to FIG. 6, a memory controller 400 may include a processor 410, a memory 420, a durability manager 430, a host interface 440, an error correction code (ECC) engine 450, a memory interface 460, and an advanced encryption standard (AES) engine 470.

Figure 22:
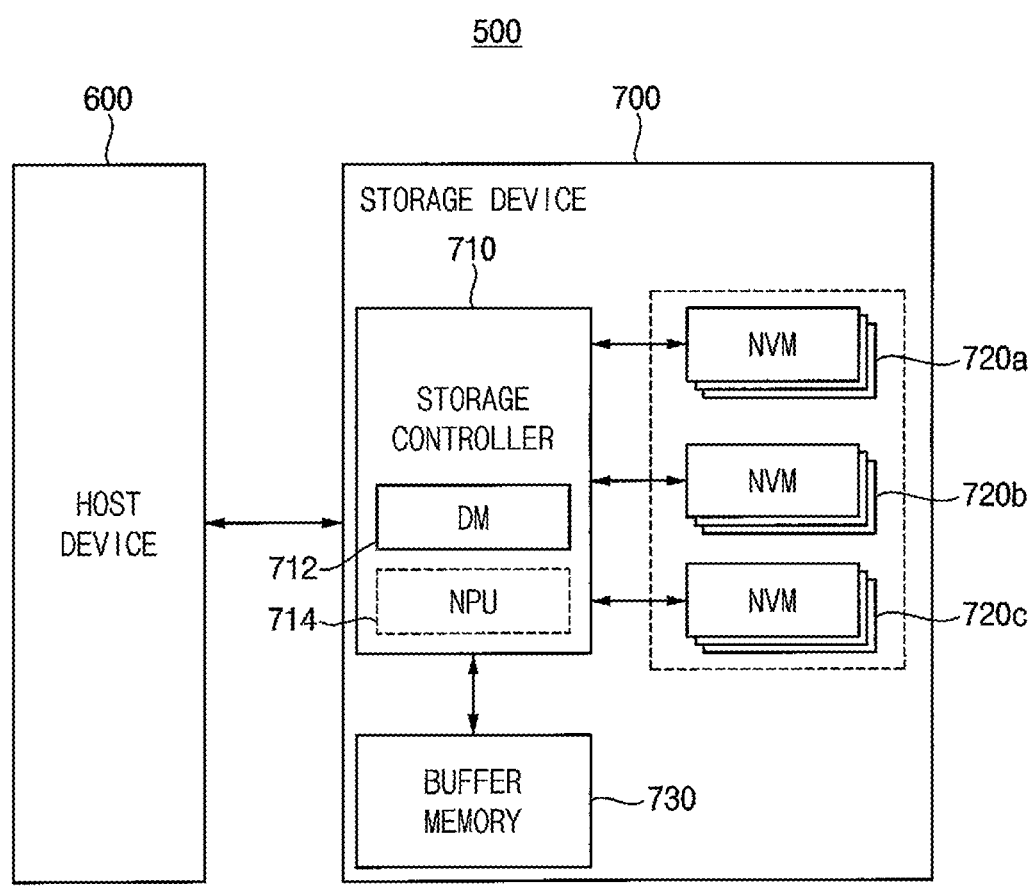
FIG. 22 is a block diagram illustrating a storage device and a storage system including the storage device according to example embodiments.

The processor 410 may control an operation of the memory controller 400 in response to a command received via the host interface 440 from a host device (e.g., the host device 600 in FIG. 22). For example, the processor 410 may control an operation of a memory system (e.g., the memory system 10 of FIG. 2), and may control respective components by employing firmware for operating the memory system.

The memory 420 may store instructions and data executed and processed by the processor 410. For example, the memory 420 may be implemented with a volatile memory with relatively small capacity and high speed, such as a static random access memory (SRAM), a cache memory, or the like.

The durability manager 430 may perform the method of measuring durability of the nonvolatile memory device according to example embodiments described with reference to FIG. 1. For example, the durability manager 430 may perform operations of generating and updating the durability information, and providing the durability information to the nonvolatile memory device (e.g., the nonvolatile memory device 40 in FIG. 2) in operation S400 of FIG. 1. In an example embodiment, at least a part of the durability manager 430 may be implemented as hardware. For example, at least a part of the durability manager 430 may be included in a computer-based electronic system. In other example embodiments, at least a part of the durability manager 430 may be implemented as instruction codes or program routines (e.g., a software program). For example, the instruction codes or the program routines may be executed by a computer-based electronic system, and may be stored in any storage device located inside or outside the computer-based electronic system.

The ECC engine 450 for error correction may perform coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc., or may perform ECC encoding and ECC decoding using above-described codes or other error correction codes.

The host interface 440 may provide physical connections between the host device and the memory system. The host interface 440 may provide an interface corresponding to a bus format of the host device for communication between the host device and the memory system. In an example embodiment, the bus format of the host device may be a small computer system interface (SCSI) or a serial attached SCSI (SAS) interface. In other example embodiments, the bus format of the host device may be a USB, a peripheral component interconnect (PCI) express (PCIe), an advanced technology attachment (ATA), a parallel ATA (PATA), a serial ATA (SATA), a nonvolatile memory (NVM) express (NVMe), etc., format.

The memory interface 460 may exchange data with the nonvolatile memory device. The memory interface 460 may transfer data to the nonvolatile memory device, or may receive data read from the nonvolatile memory device. In an example embodiment, the memory interface 460 may be connected to the nonvolatile memory device via one channel. In other example embodiments, the memory interface 460 may be connected to the nonvolatile memory device via two or more channels. For example, the memory interface 460 may be configured to comply with a standard protocol, such as Toggle or Open NAND Flash Interface (ONFI).

The AES engine 470 may perform at least one of an encryption operation and a decryption operation on data input to the memory controller 400 by using a symmetric-key algorithm. Although not illustrated in detail, the AES engine 470 may include an encryption module and a decryption module. For example, the encryption module and the decryption module may be implemented as separate modules. For another example, one module capable of performing both encryption and decryption operations may be implemented in the AES engine 470.

The AES engine 470 may receive first data transmitted from the memory 420. The encryption module may encrypt the first data, which is transmitted from the memory 420, by using an encryption key and generate second data. The second data may be transmitted from the AES engine 470 to the memory 420, and be stored in the memory 420. In addition, the AES engine 470 may receive third data transmitted from the memory 420. The third data may be data that is encrypted with the same encryption key as an encryption key used to encrypt the first data. The decryption module may decrypt the third data, which is transmitted from the memory 420, with the same encryption key as the encryption key used to encrypt the first data and generate fourth data. The fourth data may be transmitted from the AES engine 470 to the memory 420, and be stored in the memory 420.

FIG. 7 is a flowchart illustrating an example of a method of measuring durability of a nonvolatile memory device of FIG. 1.

Referring to FIGS. 1 and 7, in an operation corresponding to operation S100 of FIG. 1, a read command for the plurality of memory blocks may be received at a first time point (operation S110 of FIG. 7). For example, the read command may be a normal read command. For another example, the read command may not be a normal read command, and may be a read command specifically set for the operation of measuring durability of the plurality of memory blocks.

In an operation corresponding to operation S200 of FIG. 1, a read operation may be performed on the plurality of memory blocks at the first time point (operation S210 of FIG. 7). For example, when the plurality of memory blocks include first through m-th memory blocks (where m is a natural number greater than or equal to two), the read operation may be sequentially or substantially simultaneously performed on all of the first through m-th memory blocks. For example, the read operation may be performed once on each memory block, and may be performed only on some memory cells in each memory block.

In an operation corresponding to operation S300 of FIG. 1, a plurality of cell count values associated with the plurality of memory blocks may be output at the first time point based on a result of the read operation in operation S210 of FIG. 7 (operation S310 of FIG. 7). For example, one cell count value may be generated and output for each memory block, and thus a total of m cell count values may be generated and output when the plurality of memory blocks include the first through m-th memory blocks.

After that, in an operation corresponding to operation S100 of FIG. 1, a read command for the plurality of memory blocks may be received at a second time point at which a first time interval is elapsed from the first time point (operation S120 of FIG. 7). The read command in operation S120 of FIG. 7 may be substantially the same as the read command in operation S110 of FIG. 7.

In an operation corresponding to operation S200 of FIG. 1, a read operation may be performed on the plurality of memory blocks at the second time point (operation S220 of FIG. 7). Operation S220 of FIG. 7 may be similar to operation S210 of FIG. 7. For example, operation S220 may be performed on the same memory cells as the memory cells on which the read operation in operation S210 is performed.

In an operation corresponding to operation S300 of FIG. 1, a plurality of cell count values associated with the plurality of memory blocks may be output at the second time point based on a result of the read operation in operation S220 of FIG. 7 (operation S320 of FIG. 7). Operation S320 of FIG. 7 may be similar to operation S310 of FIG. 7. For example, the same number of cell count values as the cell count values generated and output in operation S310 may be generated and output.

In an operation corresponding to operation S400 of FIG. 1, durability information associated with the plurality of memory blocks may be stored in response to a reception of the durability information obtained by accumulating the cell count values generated and output in operations S310 and S320 of FIG. 7 (operation S420 of FIG. 7). For example, one durability value may be obtained for each memory block, and thus the durability information including a total of m durability values may be received and stored when the plurality of memory blocks include the first through m-th memory blocks. For example, operation S420 may be performed at the second time point (e.g., after the cell count values are output).

Figure 8A:
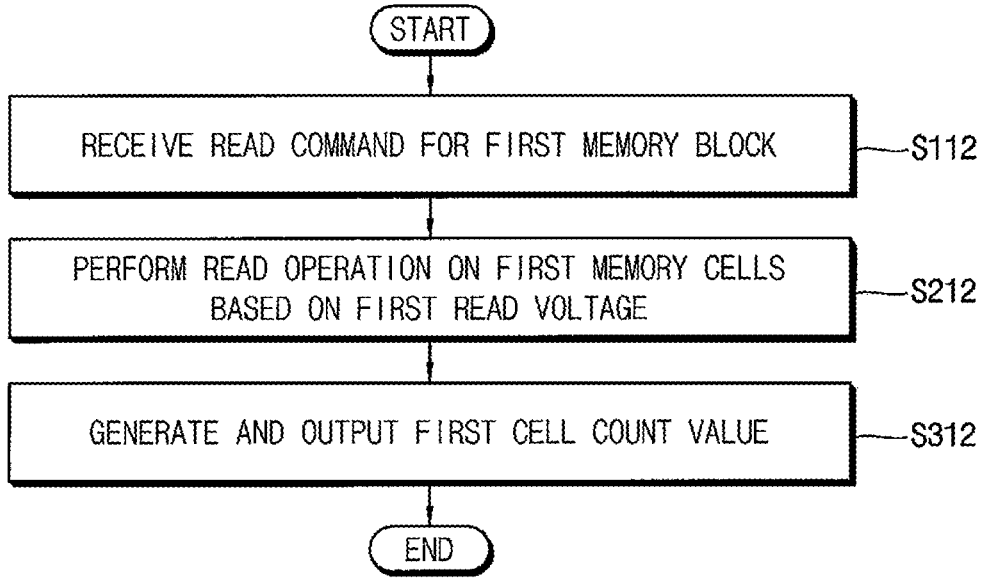
FIGS. 8A and 8B are flowcharts illustrating an example of an operation of FIG. 7.
Figure 8B:
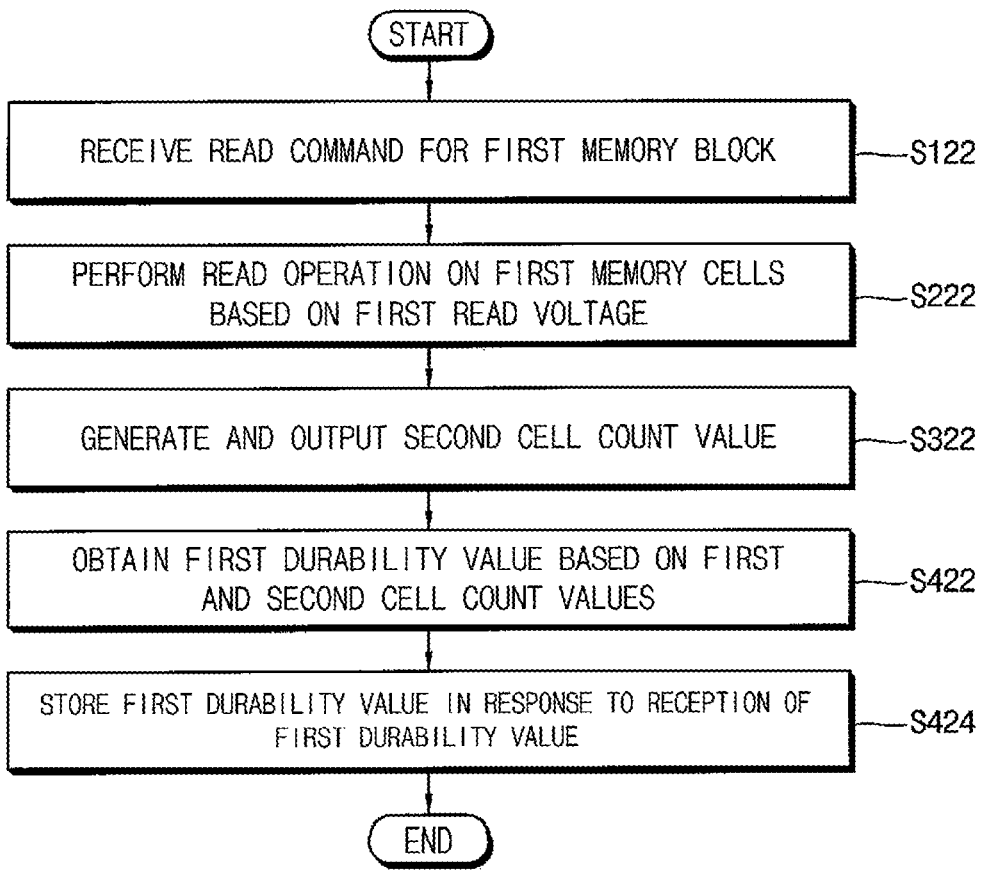

FIGS. 8A and 8B are flowcharts illustrating an example of an operation of FIG. 7. FIG. 8A illustrates an example of the operation at the first time point in FIG. 7, and FIG. 8B illustrates an example of the operation at the second time point in FIG. 7. FIGS. 8A and 8B illustrate the operation for one memory block (e.g., the first memory block).

Referring to FIGS. 7 and 8A, in an operation corresponding to operation S110 of FIG. 7, a read command for the first memory block may be received at the first time point (operation S112 of FIG. 8A). In an operation corresponding to operation S210 of FIG. 7, a read operation may be performed on first memory cells among a plurality of memory cells included in the first memory block based on a first read voltage at the first time point (operation S212 of FIG. 8A). Operations S112 and S212 will be described in detail with reference to FIG. 9.

In an example embodiment, the first memory cells may be connected to a first wordline among a plurality of wordlines connected to the first memory block. The durability of the memory block may be accurately checked only when the cell count value is periodically obtained using a distribution of threshold voltages from the wordline and the memory cells at the same location, and thus the first wordline and the first memory cells may be predetermined at an initial operation time. Thus, the read operation and the cell count operation may be performed on a predetermined specific wordline and memory cells. In an example embodiment, the first memory cells may be connected to two or more wordlines.

In an example embodiment, the first wordline may be an edge wordline among the plurality of wordlines connected to the first memory block. The edge wordline may represent a wordline that is located adjacent to edges of the memory block, and edge memory cells may represent memory cells that are connected to the edge wordline and located adjacent to the edges of the memory block. Typically, the edge wordline and the edge memory cells may have relatively low (or poor) durability and a large change in the distribution of threshold voltages, and the edge wordline and the edge memory cells may be referred to as a weak wordline and weak memory cells, respectively. The weak wordline and the weak memory cells may be determined as the first wordline and the first memory cells in advance.

In an example embodiment, when the read command is the normal read command, a read address for the first wordline and the first memory cells may be provided together with the read command, the first wordline and the first memory cells may be accessed based on the read address, and the read operation may be performed. In other example embodiments, when the read command is the read command specifically set for the operation of measuring durability of the plurality of memory blocks, the first wordline and the first memory cells may be directly accessed without a read address and the read operation may be performed, because the first wordline and the first memory cells are predetermined and fixed.

In an operation corresponding to operation S310 of FIG. 7, a first cell count value associated with the first memory cells may be generated and output based on a result of the read operation in operation S212 of FIG. 8A at the first time point (operation S312 of FIG. 8A). For example, operation S312 may be performed by the cell counter 170 in FIG. 3. Operation S312 will be described further with reference to FIG. 10A.

In an example embodiment, the first cell count value may represent the number of on-cells among the first memory cells at the first time point. For example, the on-cells may represent memory cells having a threshold voltage lower than the first read voltage among the first memory cells.

Referring to FIGS. 7 and 8B, in an operation corresponding to operation S120 of FIG. 7, a read command for the first memory block may be received at the second time point (operation S122 of FIG. 8B). In an operation corresponding to operation S220 of FIG. 7, a read operation may be performed on the first memory cells based on the first read voltage at the second time point (operation S222 of FIG. 8B). In an operation corresponding to operation S320 of FIG. 7, a second cell count value associated with the first memory cells may be generated and output based on a result of the read operation in operation S222 of FIG. 8B at the second time point (operation S322 of FIG. 8B). Operations S122, S222 and S322 may be similar to operations S112, S212 and S312 in FIG. 8A, respectively.

In an operation corresponding to operation S420 of FIG. 7, a first durability value associated with the first memory block may be obtained based on the first cell count value and the second cell count value (operation S422 of FIG. 8B), and the first durability value may be stored in response to a reception of the first durability value (operation S424 of FIG. 8B). For example, operation S422 may be performed by the durability manager 430 in FIG. 6. For example, the first durability value may be stored in the first memory block or in a specific region in the nonvolatile memory device for storing and/or managing the durability information.

In an example embodiment, the first durability value may correspond to a change (or variation) in the number of on-cells among the first memory cells. Operation S422 will be described further with reference to FIGS. 9, 10A and 10B.

Figure 9:
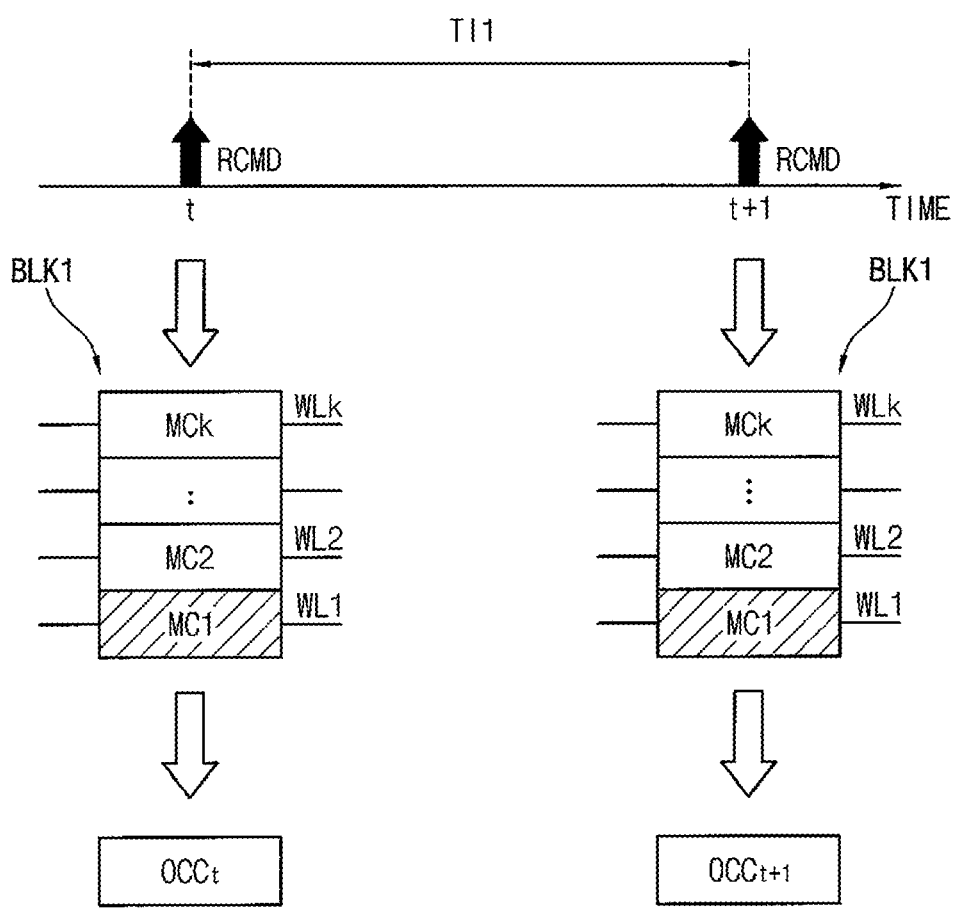
FIGS. 9, 10A and 10B are diagrams for describing an operation of FIGS. 8A and 8B.
Figure 10A:
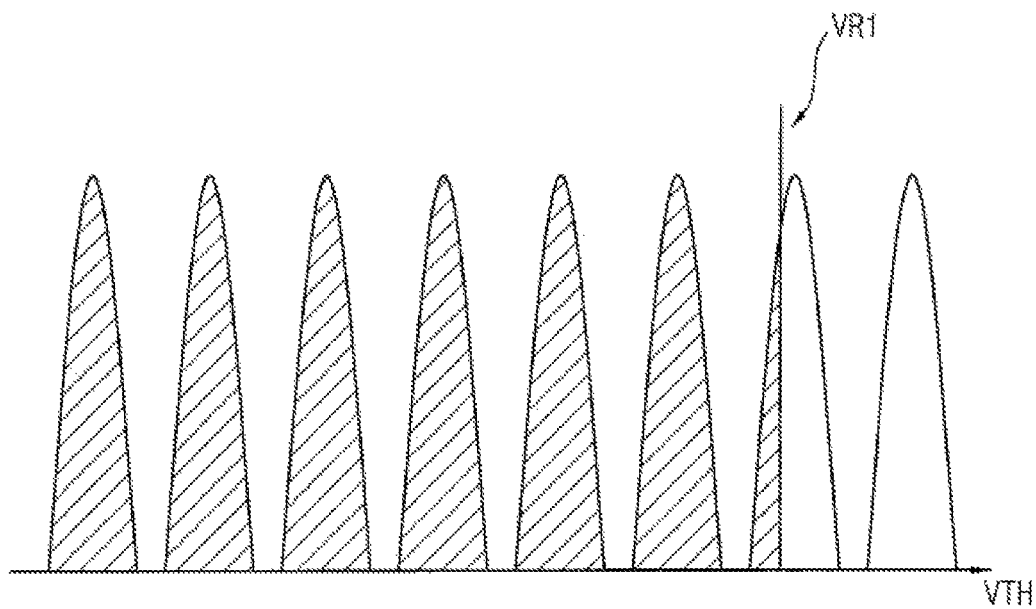
Figure 10B:
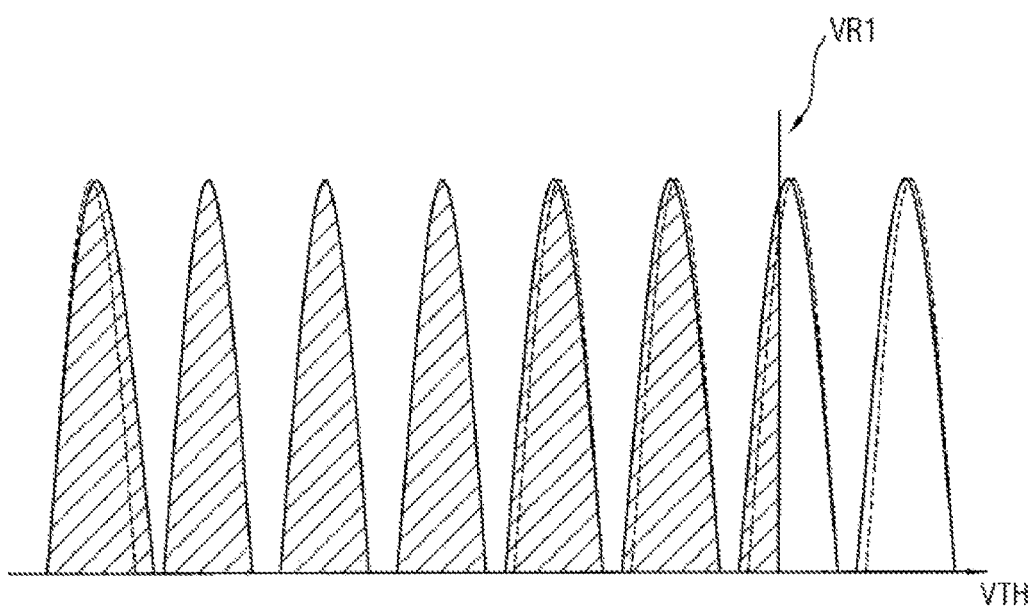

FIGS. 9, 10A, and 10B are diagrams for describing an operation of FIGS. 8A and 8B.

Referring to FIGS. 9, 10A, and 10B, at a first time point t, a read command RCMD for measuring durability of a first memory block BLK1 may be received. The first memory block BLK1 may include memory cells MC1, MC2, ..., MCk connected to wordlines WL1, WL2, ..., WLk (where k is a natural number greater than or equal to two), and a first cell count value $OCC_t$ may be obtained by performing a read operation on a first memory cells MC1 connected to a first wordline WL1. Referring to FIG. 10A, the first cell count value $OCC_t$ may represent the number of memory cells (e.g., on-cells) in which a threshold voltage VTH is lower than a first read voltage VR1 among the first memory cells MC1 at the first time point t. For example, an area of hatched portions in FIG. 10A may correspond to the first cell count value $OCC_t$.

After that, at a second time point t+1 at which a first time interval TI1 is elapsed from the first time point t, the read command RCMD for measuring the durability of the first memory block BLK1 may be received. A second cell count value $OCC_{t+1}$ may be obtained by performing a read operation on the first memory cells MC1 connected to the first wordline WL1 of the first memory block BLK1. Referring to FIG. 10B, the second cell count value $OCC_{t+1}$ may represent the number of memory cells in which the threshold voltage VTH is lower than the first read voltage VR1 among the first memory cells MC1 at the second time point t+1. For example, an area of hatched portions in FIG. 10B may correspond to the second cell count value $OCC_{t+1}$.

In FIG. 10B, dotted lines may represent a distribution of the threshold voltage VTH of the first memory cells MC1 at the first time point t, e.g., an initial distribution of the threshold voltage illustrated in FIG. 10A. Referring to FIG. 10B, the distribution of the threshold voltage VTH of the first memory cells MC1 may be changed from the dotted lines to solid lines as the first time interval TI1 is elapsed. According to example embodiments, the change in the distribution of the threshold voltage VTH may be measured by performing the periodic monitoring, and the durability of the memory block may be measured based on the amount of such change. For example, the change in the distribution of the threshold voltage VTH may be checked or determined based on the accumulated cell count values (or information).

In an example embodiment, the first durability value may be obtained based on Equation 1 and using the first cell count value $OCC_t$ and the second cell count value $OCC_{t+1}$.

$$\text{Durability} = (1 - \gamma(OCC_{t+1} - OCC_t)) \quad \text{[Equation 1]}$$

In Equation 1, γ represents a normalization factor. The first durability value obtained based on Equation 1 may be calculated when two or more cell count values are accumulated. If there is no change in the cell count value, the first durability value may be calculated as one. If the change in the cell count value increases, the first durability value may be closer to zero. If the change in the cell count value is relatively small, it may be determined that the memory block has high (or good) durability. If the change in the cell count value is relatively large, it may be determined that the memory block has low (or poor) durability. Thus, it may be determined that the first memory block BLK1 has high durability as the first durability value increases, and it may be determined that the first memory block BLK1 has low durability as the first durability value decreases.

Although FIGS. 10A and 10B illustrate an example where the memory cells are triple-level cells (TLCs), example embodiments are not limited thereto, and the memory cells may be one of various types of memory cells such as multi-level cells (MLC), quad-level cells (QLC), or the like.

Figure 11:
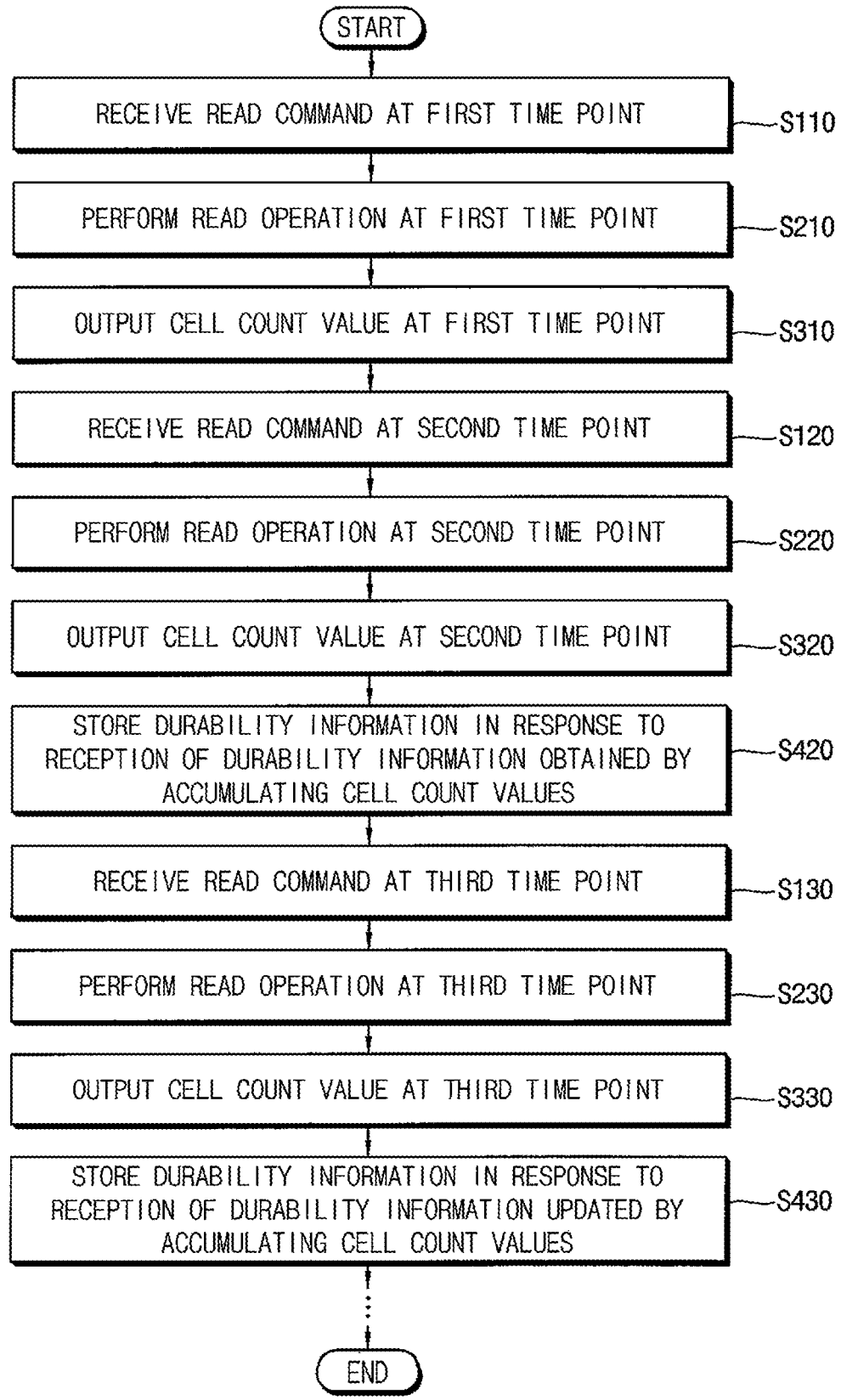
FIG. 11 is a flowchart illustrating another example of a method of measuring durability of a nonvolatile memory device of FIG. 1.

FIG. 11 is a flowchart illustrating another example of a method of measuring durability of a nonvolatile memory device of FIG. 1. The descriptions repeated with respect to FIG. 7 will be omitted.

Referring to FIGS. 1 and 11, operations S110, S210, S310, S120, S220, S320 and S420 may be substantially the same as operations S110, S210, S310, S120, S220, S320 and S420 in FIG. 7, respectively.

After that, in an operation corresponding to operation S100 of FIG. 1, a read command for the plurality of memory blocks may be received at a third time point at which the first time interval is elapsed from the second time point (operation S130 of FIG. 11). The read command in operation S130 may be substantially the same as the read command in operations S110 and S120.

In an operation corresponding to operation S200 of FIG. 1, a read operation may be performed on the plurality of memory blocks at the third time point (operation S230 of FIG. 11). Operation S230 may be similar to operations S210 and S220. For example, operation S230 may be performed on the same memory cells as the memory cells on which the read operation in operation S210 and S220 is performed.

In an operation corresponding to operation S300 of FIG. 1, a plurality of cell count values associated with the plurality of memory blocks may be output at the third time point based on a result of the read operation in operation S230 of FIG. 11 (operation S330 of FIG. 11). Operation S330 may be similar to operations S310 and S320. For example, the same number of cell count values as the cell count values generated and output in operations S310 and S320 may be generated and output.

In an operation corresponding to operation S400 of FIG. 1, durability information associated with the plurality of memory blocks may be stored in response to a reception of the durability information updated by accumulating the cell count values generated and output in operations S310, S320, and S330 of FIG. 11 (operation S430 of FIG. 11). Operation S430 may be similar to operation S420, and the above Equation for generating the durability value may be partially changed.

Although not illustrated in detail, operations similar to operations S130, S230, S330 and S430 may be repeatedly performed even after the third time point. For example, the operations similar to operations S130, S230, S330 and S430 may be performed at a fourth time point at which the first time interval is elapsed from the third time point.

Figure 12:
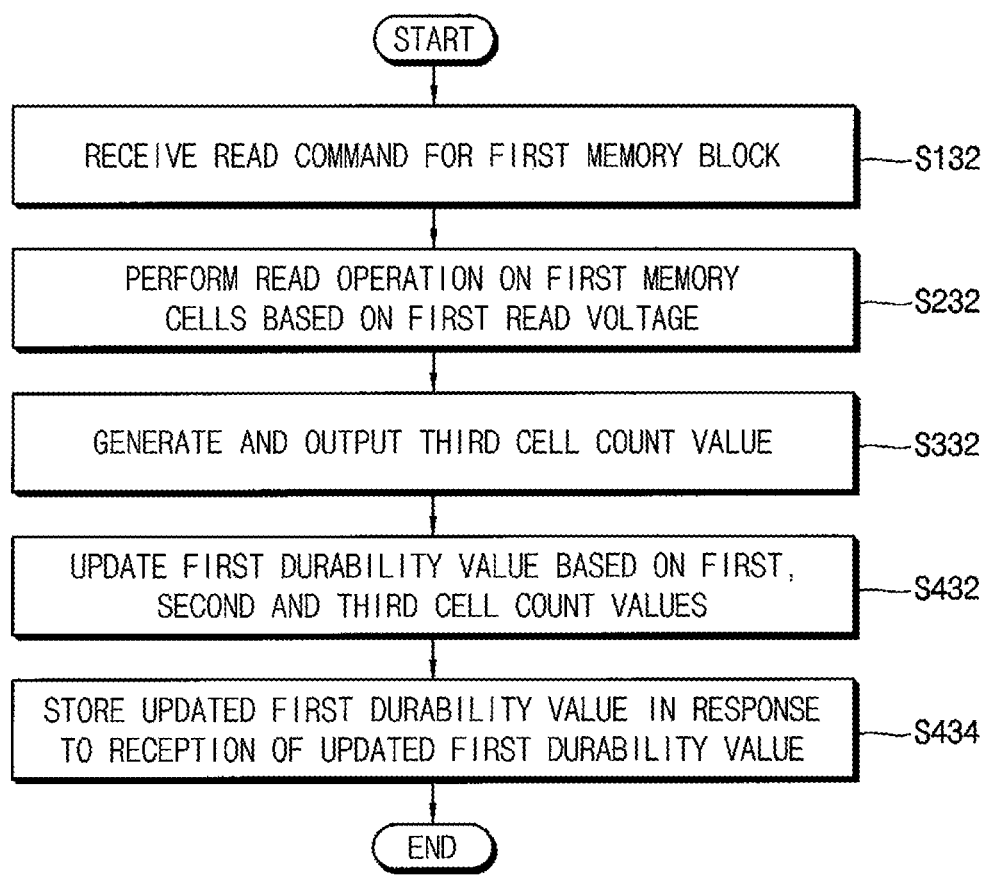
FIG. 12 is a flowchart illustrating an example of an operation of FIG. 11.

FIG. 12 is a flowchart illustrating an example of an operation of FIG. 11. FIG. 12 illustrates the operation at the third time point in FIG. 11 and the operation for one memory block (e.g., the first memory block). The descriptions repeated with respect to FIGS. 8A and 8B will be omitted.

Referring to FIGS. 11 and 12, in an operation corresponding to operation S130 of FIG. 11, a read command for the first memory block may be received at the third time point (operation S132 of FIG. 12). In an operation corresponding to operation S230 of FIG. 11, a read operation may be performed on the first memory cells based on the first read voltage at the third time point (operation S232 of FIG. 12). In an operation corresponding to operation S330 of FIG. 11, a third cell count value associated with the first memory cells may be generated and output based on a result of the read operation in operation S232 of FIG. 12 at the third time point (operation S332 of FIG. 12). Operations S132, S232, and S332 may be similar to operations S112, S212 and S312 in FIG. 8A, respectively.

In an operation corresponding to operation S430 of FIG. 11, the first durability value associated with the first memory block may be updated based on the first cell count value, the second cell count value, and the third cell count value (operation S432 of FIG. 12), and the updated first durability value may be stored in response to a reception of the updated first durability value (operation S434 of FIG. 12). Operations S432 and S434 may be similar to operations S422 and S424 in FIG. 8B, respectively.

Figure 13:
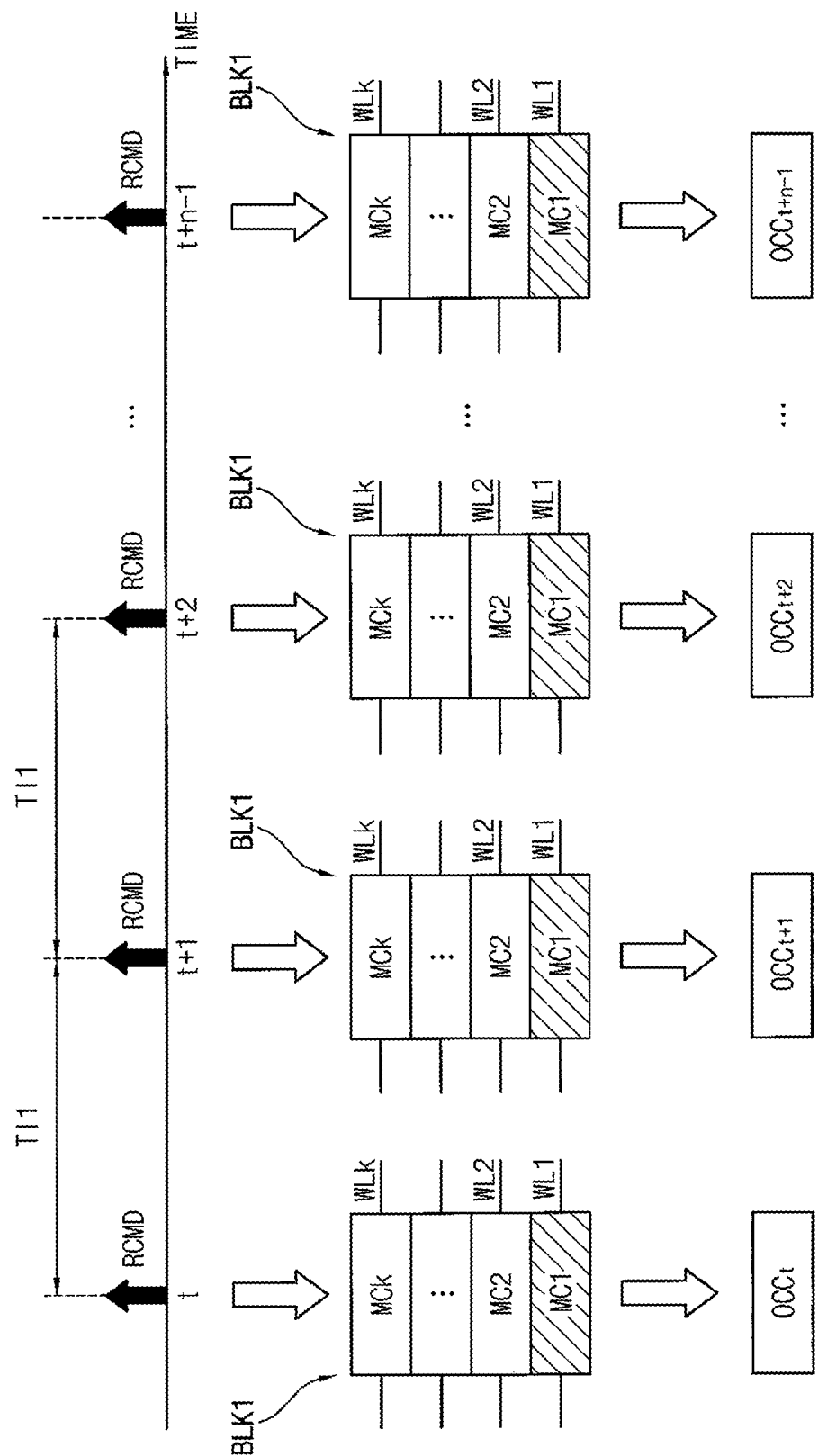
FIGS. 13 and 14 are diagrams for describing an operation of FIG. 12.
Figure 14:
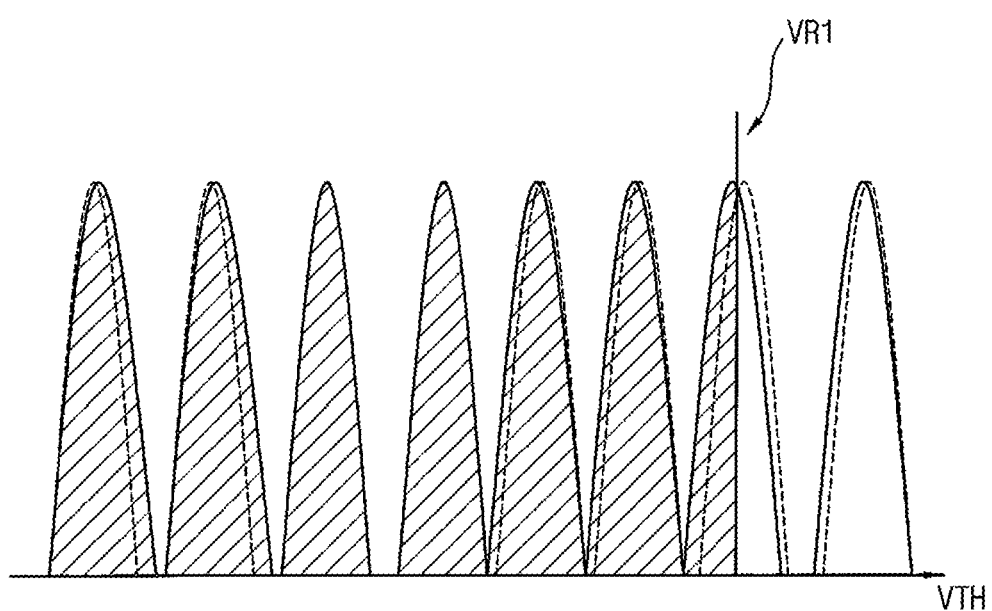

FIGS. 13 and 14 are diagrams for describing an operation of FIG. 12. The descriptions repeated with respect to FIGS. 9, 10A, and 10B will be omitted.

Referring to FIGS. 13 and 14, operations at the first time point t and the second time point t+1 may be substantially the same as that described with reference to FIGS. 9, 10A and 10B.

After that, at a third time point t+2 at which the first time interval TI1 is elapsed from the second time point t+1, the read command RCMD for measuring the durability of the first memory block BLK1 may be received. A third cell count value $OCC_{t+2}$ may be obtained by performing a read operation on the first memory cells MC1 connected to the first wordline WL1 of the first memory block BLK1. Referring to FIG. 14, the third cell count value $OCC_t+2$ may represent the number of memory cells in which the threshold voltage VTH is lower than the first read voltage VR1 among the first memory cells MC1 at the third time point t+2. For example, an area of hatched portions in FIG. 14 may correspond to the third cell count value $OCC_{t+2}$. In FIG. 14, dotted lines may represent the distribution of the threshold voltage VTH of the first memory cells MC1 at the first time point t, e.g., the initial distribution of the threshold voltage illustrated in FIG. 10A.

Similarly, at an n-th time point t+n−1 (where n is a natural number greater than or equal to two), the read command RCMD for measuring the durability of the first memory block BLK1 may be received, and an n-th cell count value $OCC_{t+n-1}$ may be obtained by performing a read operation on the first memory cells MC1 connected to the first wordline WL1 of the first memory block BLK1.

In an example embodiment, the first durability value may be obtained based on Equation 2 and using the first cell count value $OCC_t$ through the n-th cell count value $OCC_{t+n-1}$.

$$\text{Durability} = \frac{1}{n-1}(1 - \gamma(OCC_{t+1} - OCC_t)) + \frac{1}{n-1}(1 - \gamma(OCC_{t+2} - OCC_{t+1})) + \cdots + \frac{1}{n-1}(1 - \gamma(OCC_{t+n-1} - OCC_{t+n-2}))$$ [Equation 2]

In Equation 2, n represents the number of accumulated cell count values. When three or more cell count values are accumulated, the first durability value may be finally calculated as an average value of the changes in the cell count values for each time interval.

FIG. 15 is a flowchart illustrating still another example of a method of measuring durability of a nonvolatile memory device of FIG. 1. The descriptions repeated with respect to FIG. 7 will be omitted.

Referring to FIGS. 1 and 15, in an operation corresponding to operation S100 of FIG. 1, a read command for the plurality of memory blocks may be received at a first time point (operation S150 of FIG. 15). Operation S150 of FIG. 15 may be similar to operation S110 in FIG. 7.

In an operation corresponding to operation S200 of FIG. 1, read operations may be performed on the plurality of memory blocks at the first time point (operation S250 of FIG. 15). Operation S250 of FIG. 15 may be similar to operation S210 in FIG. 7 but, unlike operation S210 in FIG. 7, the read operations may be performed twice or more on each memory block.

In an operation corresponding to operation S300 of FIG. 1, a plurality of cell count values associated with the plurality of memory blocks may be output at the first time point based on a result of the read operations in operation S250 of FIG. 15 (operation S350 of FIG. 15). Operation S350 of FIG. 15 may be similar to operation S310 in FIG. 7. As described above, as the read operations are performed twice or more on each memory block, and as one cell count value is generated based on one read operation, cell count values the number of which is greater than the number of the memory blocks may be generated and output in operation S350 of FIG. 15.

In an operation corresponding to operation S400 of FIG. 1, durability information associated with the plurality of memory blocks may be stored in response to a reception of the durability information obtained based on the cell count values generated and output in operation S350 of FIG. 15 (operation S450 of FIG. 15). Unlike the example of FIG. 7, two or more cell count values may be generated for each memory block at the first time point, and thus one durability value may be obtained for each memory block even at the first time point.

After that, in an operation corresponding to operation S100 of FIG. 1, a read command for the plurality of memory blocks may be received at a second time point at which a first time interval is elapsed from the first time point (operation S160 of FIG. 15). In an operation corresponding to operation S200 of FIG. 1, read operations may be performed on the plurality of memory blocks at the second time point (operation S260 of FIG. 15). In an operation corresponding to operation S300 of FIG. 1, a plurality of cell count values associated with the plurality of memory blocks may be output at the second time point based on a result of the read operations in operation S260 of FIG. 15 (operation S360 of FIG. 15). In an operation corresponding to operation S400 of FIG. 1, durability information associated with the plurality of memory blocks may be stored in response to a reception of the durability information updated based on the cell count values generated and output in operation S360 of FIG. 15 and the durability information obtained in operation S450 of FIG. 15 (operation S460 of FIG. 15). Operations S160, S260, S360, and S460 may be similar to operations S150, S250, S350, and S450, respectively.

Although not illustrated in detail, operations similar to operations S160, S260, S360, and S460 may be repeatedly performed even after the second time point.

Figure 16A:
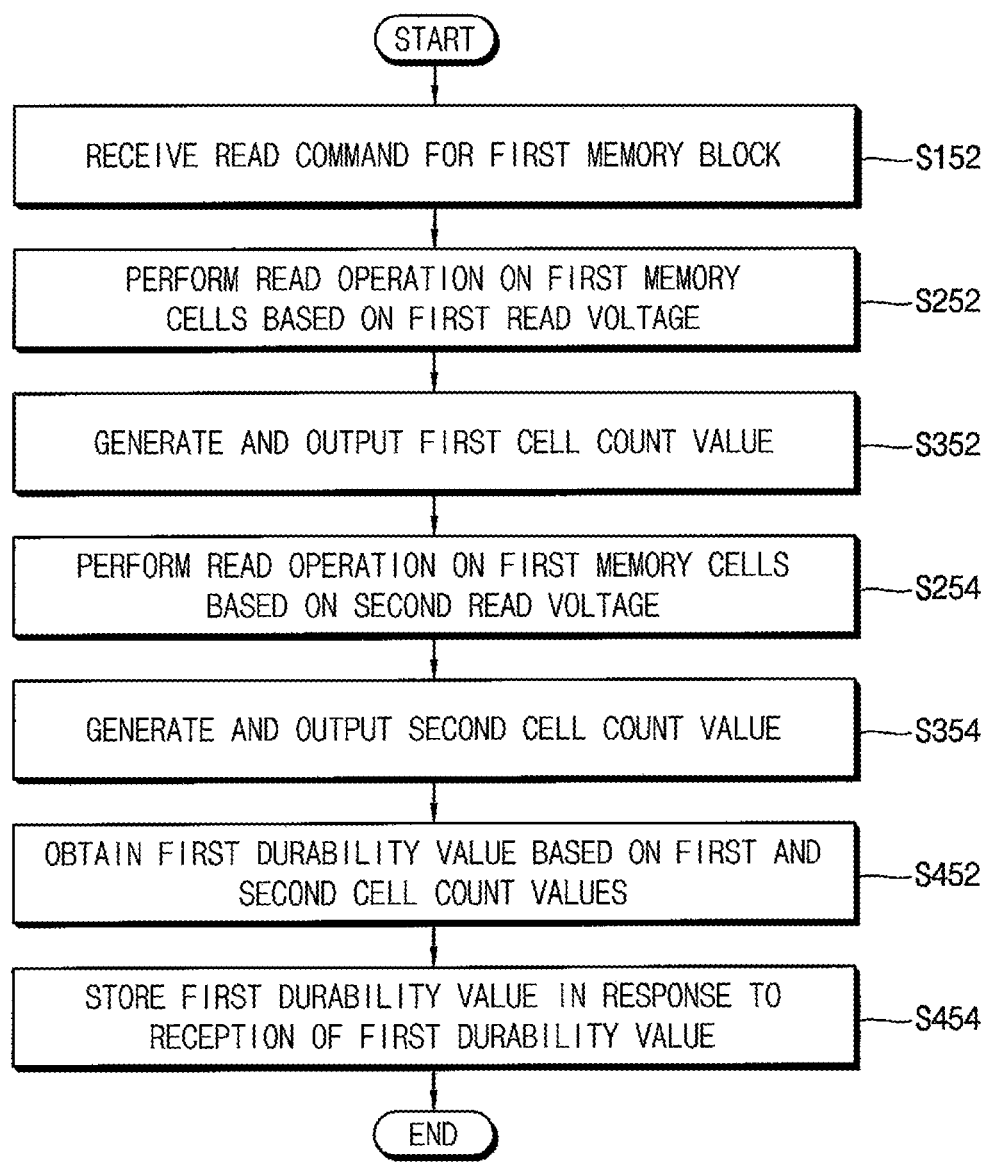
FIGS. 16A and 16B are flowcharts illustrating an example of an operation of FIG. 15.
Figure 16B:
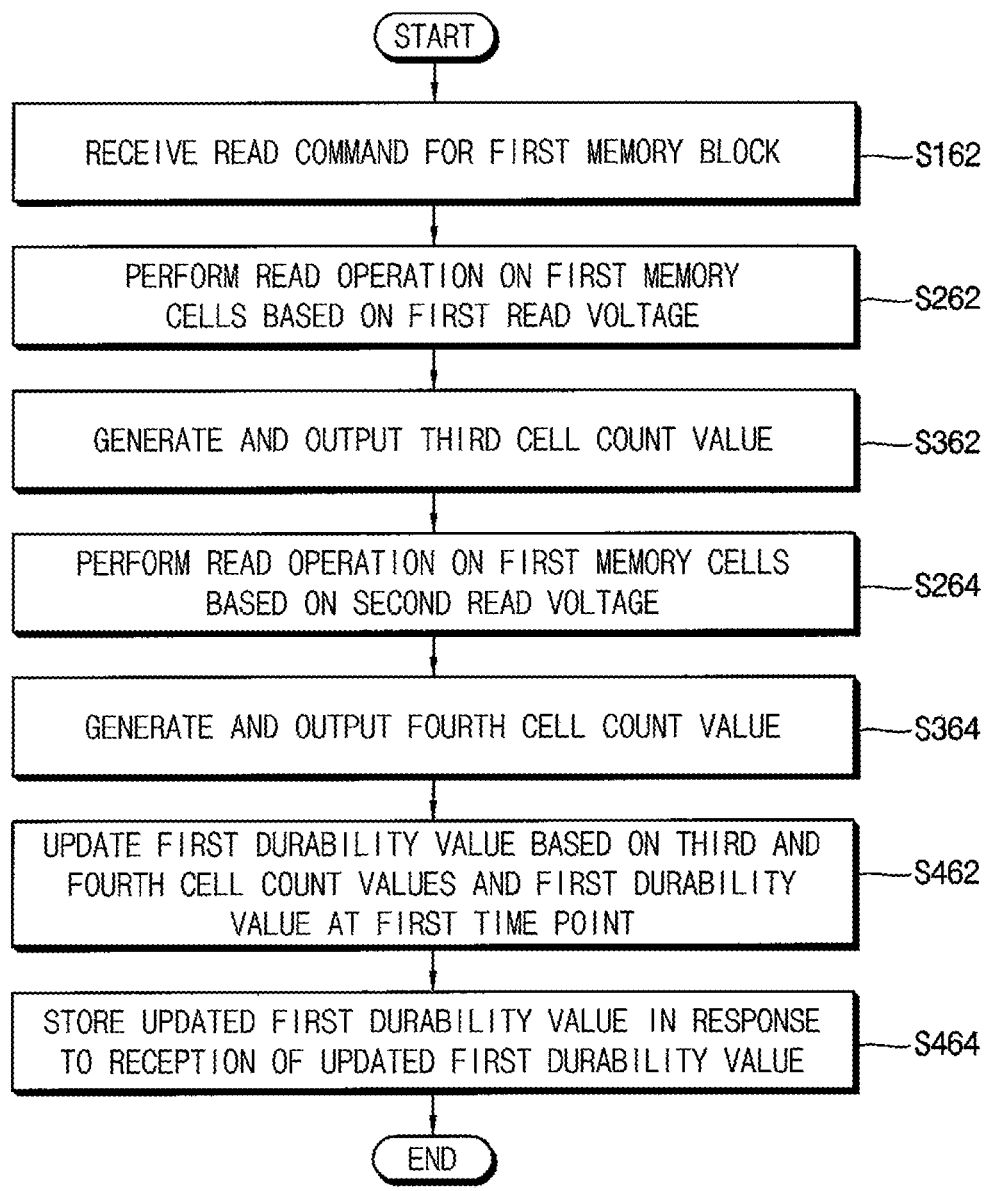

FIGS. 16A and 16B are flowcharts illustrating an example of an operation of FIG. 15. FIG. 16A illustrates an example of the operation at the first time point in FIG. 15, and FIG. 16B illustrates an example of the operation at the second time point in FIG. 15. FIGS. 16A and 16B illustrate the operation for one memory block (e.g., the first memory block). The descriptions repeated with respect to FIGS. 8A and 8B will be omitted.

Referring to FIGS. 15 and 16A, in an operation corresponding to operation S150 of FIG. 15, a read command for the first memory block may be received at the first time point (operation S152 of FIG. 16A). In an operation corresponding to operation S250 of FIG. 15, a read operation may be performed on first memory cells among a plurality of memory cells included in the first memory block based on a first read voltage at the first time point (operation S252 of FIG. 16A). In an operation corresponding to operation S350 of FIG. 15, a first cell count value associated with the first memory cells may be generated and output based on a result of the read operation in operation S252 of FIG. 16A at the first time point (operation S352 of FIG. 16A). Operations S152, S252 and S352 of FIG. 16A may be similar to operations S112, S212 and S312 in FIG. 8A, respectively.

After that, in an operation corresponding to operation S250 of FIG. 15, a read operation may be performed on the first memory cells based on a second read voltage different from the first read voltage at the first time point (operation S254 of FIG. 16A). In an operation corresponding to operation S350 of FIG. 15, a second cell count value associated with the first memory cells may be generated and output based on a result of the read operation in operation S254 of FIG. 16A at the first time point (operation S354 of FIG. 16A). Operations S254 and S354 may be similar to operations S252 and S352, respectively, except that the read voltage is changed.

Figure 17:
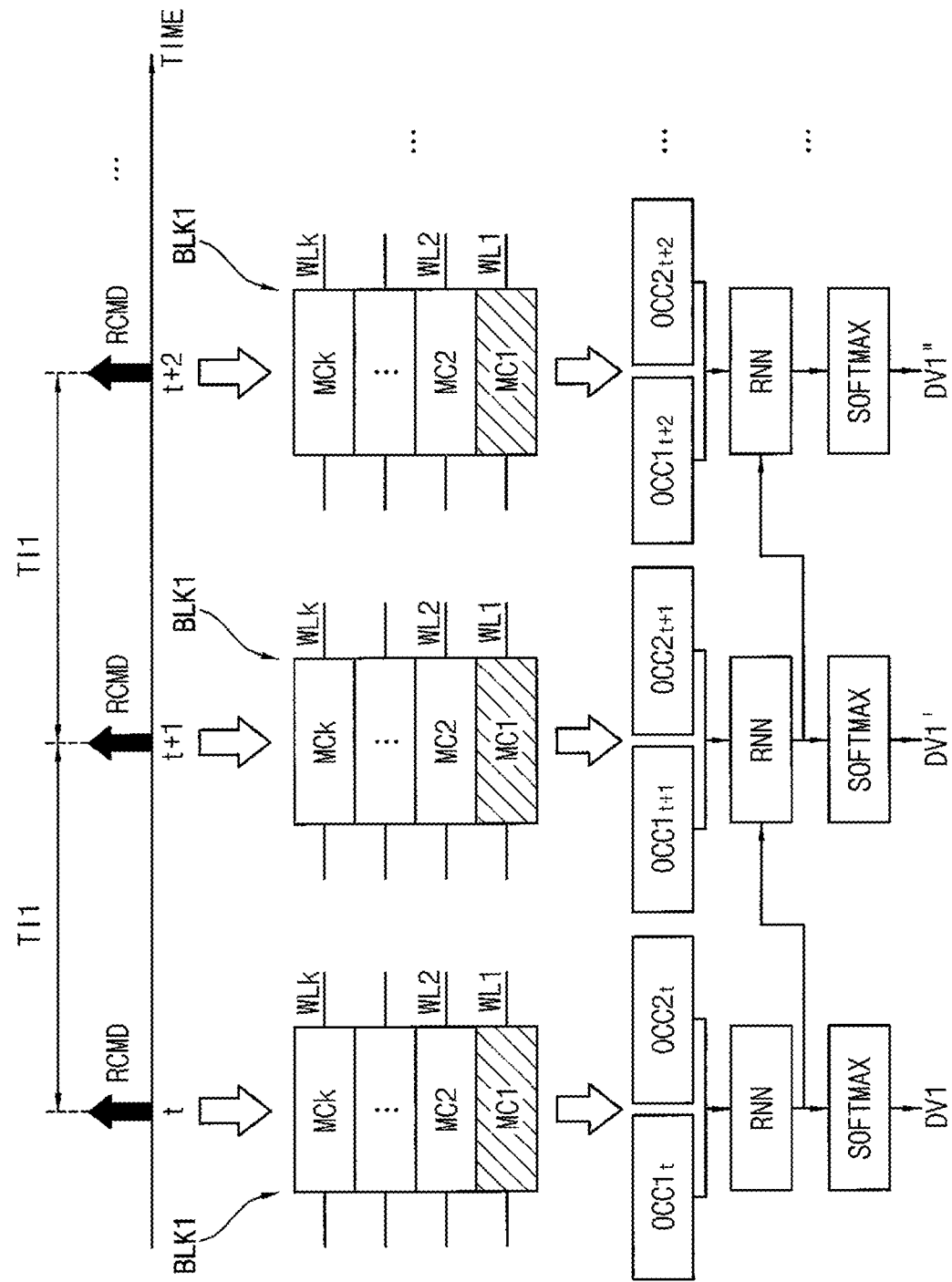
FIGS. 17, 18A, 18B and 18C are diagrams for describing an operation of FIGS. 16A and 16B.
Figure 18A:
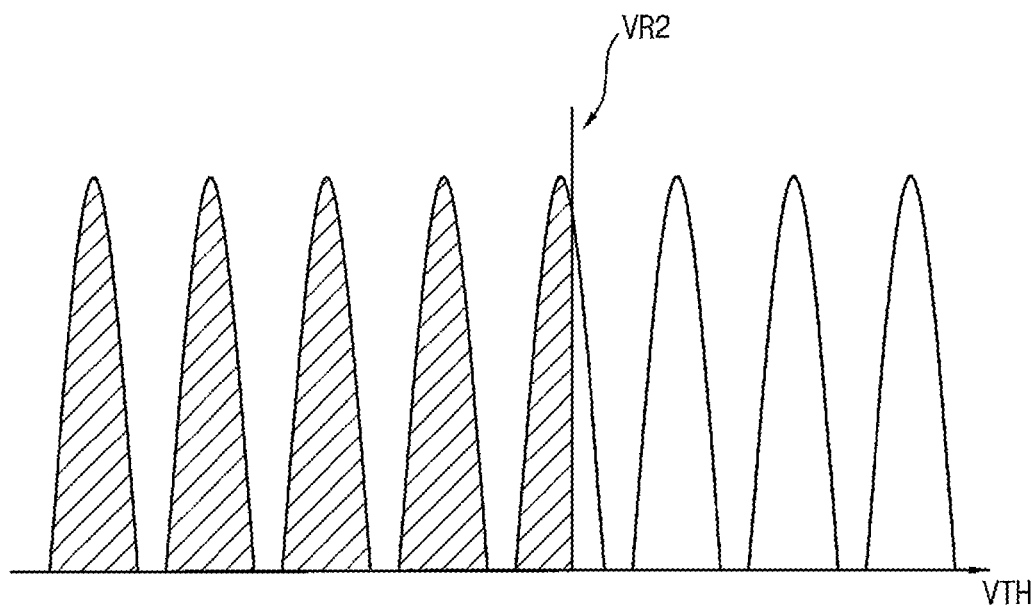
Figure 18B:
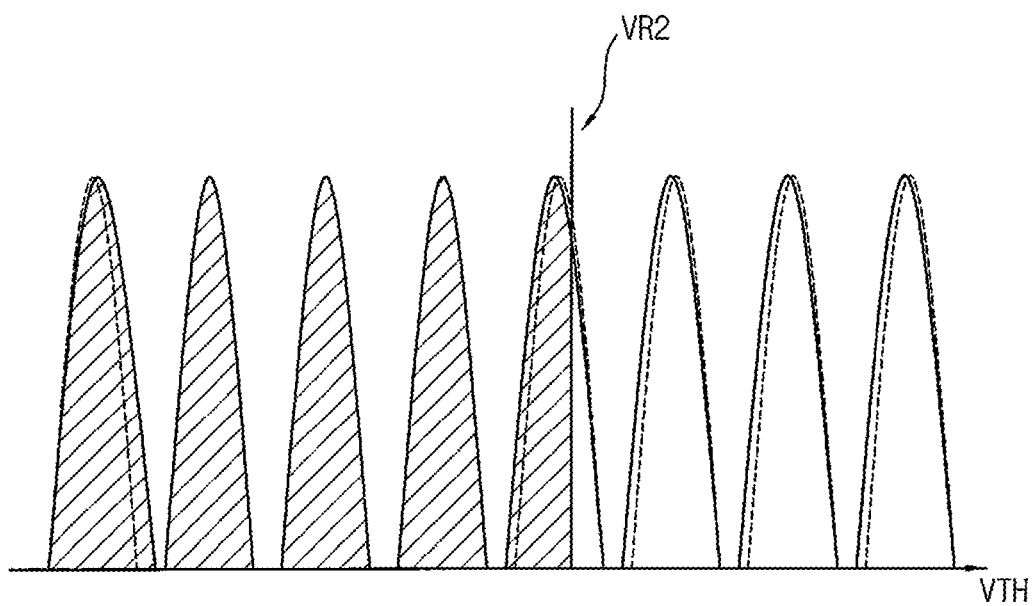
Figure 18C:
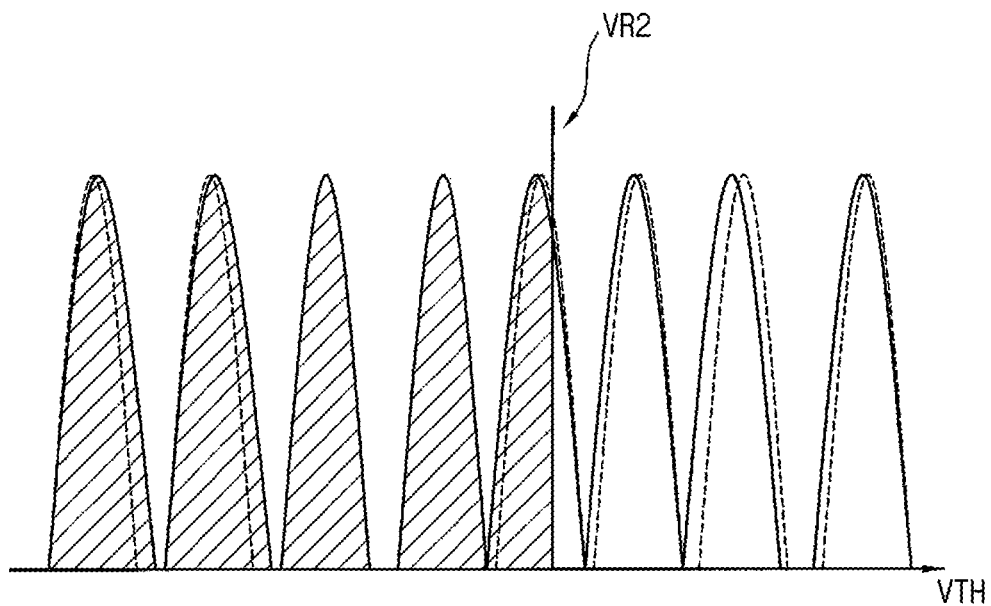

In an operation corresponding to operation S450 of FIG. 15, a first durability value associated with the first memory block may be obtained based on the first cell count value and the second cell count value at the first time point (operation S452 of FIG. 16A), and the first durability value at the first time point may be stored in response to a reception of the first durability value (operation S454 of FIG. 16A). In an example embodiment, the first durability value may be obtained using a recurrent neural network (RNN). Operation S452 will be described further with reference to FIG. 17.

Referring to FIGS. 15 and 16B, in an operation corresponding to operation S160 of FIG. 15, a read command for the first memory block may be received at the second time point (operation S162 of FIG. 16B). In an operation corresponding to operation S260 of FIG. 15, a read operation may be performed on the first memory cells based on the first read voltage at the second time point (operation S262 of FIG. 16B). In an operation corresponding to operation S360 of FIG. 15, a third cell count value associated with the first memory cells may be generated and output based on a result of the read operation in operation S262 at the second time point (operation S362 of FIG. 16B). In an operation corresponding to operation S260 of FIG. 15, a read operation may be performed on the first memory cells based on the second read voltage at the second time point (operation S264 of FIG. 16B). In an operation corresponding to operation S360 of FIG. 15, a fourth cell count value associated with the first memory cells may be generated and output based on a result of the read operation in operation S264 of FIG. 16B at the second time point (operation S364 of FIG. 16B). In an operation corresponding to operation S460 of FIG. 15, the first durability value associated with the first memory block may be updated based on the first durability value at the first time point obtained in operation S452 of FIG. 16A, the third cell count value, and the fourth cell count value at the second time point (operation S462 of FIG. 16B), and the updated first durability value at the second time point may be stored in response to a reception of the updated first durability value (operation S464 of FIG. 16B). Operations S162, S262, S362, S264, S364, S462, and S464 of FIG. 16B may be similar to operations S152, S252, S352, S254, S354, S452, and S454 in FIG. 16A, respectively.

FIGS. 17, 18A, 18B, and 18C are diagrams for describing an operation of FIGS. 16A and 16B. The descriptions repeated with respect to FIGS. 9, 10A, 10B, 13, and 14 will be omitted.

Referring to FIGS. 17, 18A, 18B, and 18C, the cell count values $OCC1_t$, $OCC1_{t+1}$, and $OCC1_{t+2}$ may be obtained at the first time point t, the second time point t+1, and the third time point t+2, respectively, based on the first read voltage VR1 as described above in connection with FIGS. 9, 10A, 10B, 13, and 14.

In addition, cell count values $OCC2_t$, $OCC2_{t+1}$, and $OCC2_{t+2}$ may be obtained at the first time point t, the second time point t+1, and the third time point t+2, respectively, based on a second read voltage VR2 different from the first read voltage VR1. Examples of FIGS. 18A, 18B, and 18C may be substantially the same as the examples of FIGS. 10A, 10B, and 14, respectively, except that the read voltage is changed.

First durability values DV1, DV1', and DV1" may be obtained using an RNN and a softmax function. For example, at the first time point t, the first durability value DV1 may be obtained based on the cell count values $OCC1_t$ and $OCC2_t$. At the second time point t+1, the updated first durability value DV1' may be obtained based on the cell count values $OCC1_{t+1}$ and $OCC2_{t+1}$ and the first durability value DV1 that is previously obtained. At the third time point t+2, the updated first durability value DV1" may be obtained based on the cell count values $OCC1_{t+2}$ and $OCC2_{t+2}$ and the previously obtained first durability value DV1'.

The RNN may be a neural network used to predict time-series data. The accumulated cell count information may be time-continuous information, and thus the durability may be accurately measured using the RNN. For example, when a large number of consecutive cell count information are used as inputs, the RNN may accurately detect the change in the distribution of the threshold voltage as compared to the Equation. The softmax function may be a function that converts a score value, which is a predicted result, into a probability value.

Figure 19:
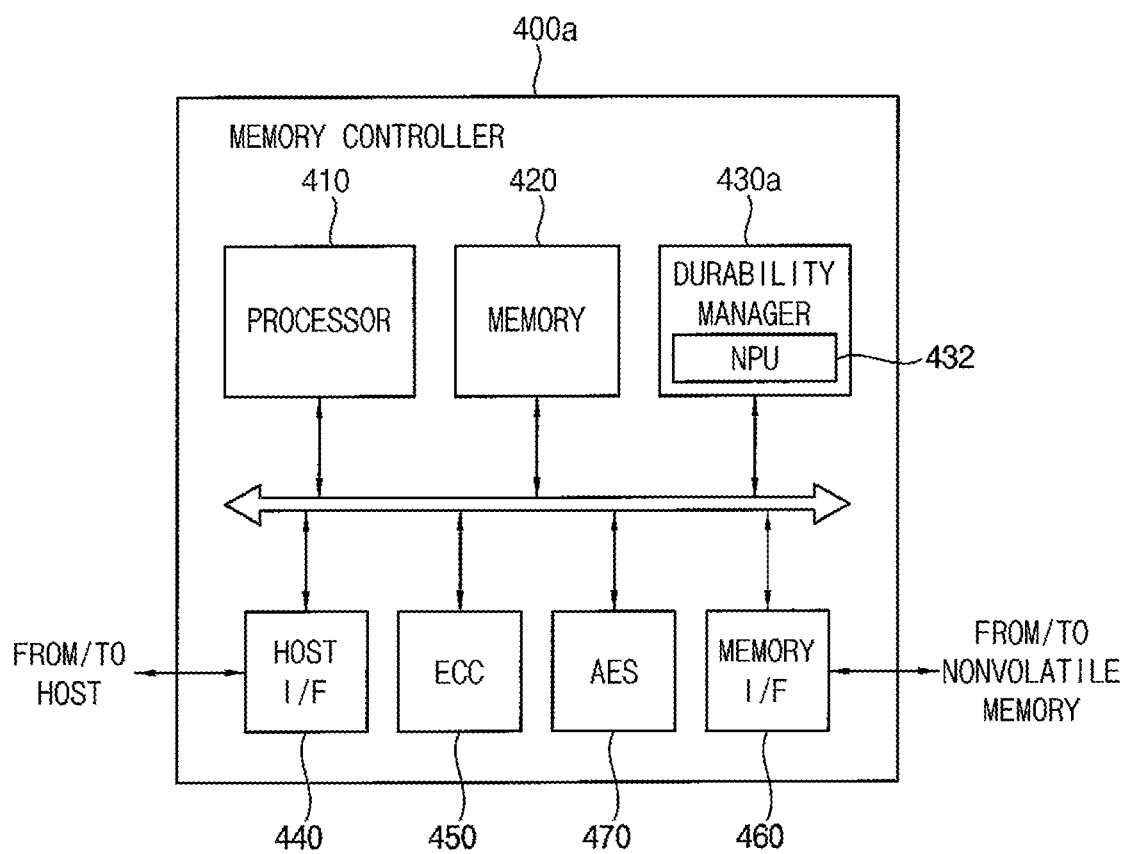
FIG. 19 is a block diagram illustrating another example of a memory controller included in a memory system according to example embodiments.

FIG. 19 is a block diagram illustrating another example of a memory controller included in a memory system according to example embodiments. The descriptions repeated with respect to FIG. 6 will be omitted.

Referring to FIG. 19, a memory controller 400a may include a processor 410, a memory 420, a durability manager 430a, a host interface 440, an error correction code (ECC) engine 450, a memory interface 460, and an advanced encryption standard (AES) engine 470.

The memory controller 400a may be substantially the same as the memory controller 400 of FIG. 6, except that the durability manager 430a includes a neural processing unit (NPU) 432. The RNN described above may be driven and executed by the NPU 432.

Figure 20:
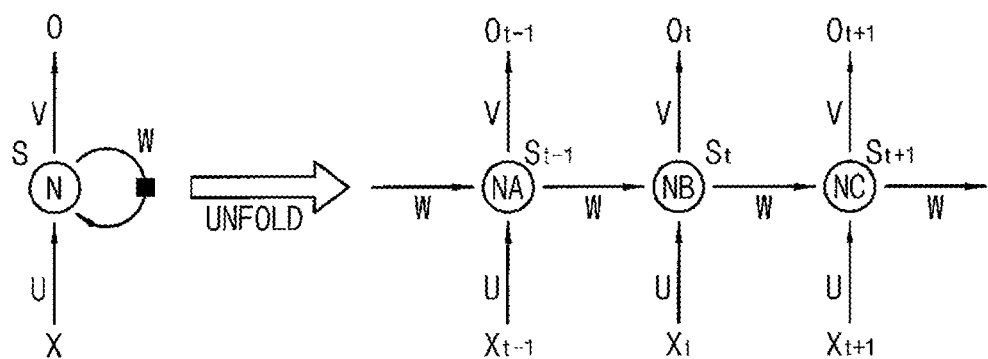
FIG. 20 is a diagram for describing an example of a network structure of a recurrent neural network (RNN) that is driven according to example embodiments.

FIG. 20 is a diagram for describing an example of a network structure of a recurrent neural network (RNN) that is driven according to example embodiments.

Referring to FIG. 20, an RNN may include a repeating structure using a specific node or cell N illustrated on the left side of FIG. 20.

A structure illustrated on the right side of FIG. 20 may represent that a recurrent connection of the RNN illustrated on the left side is unfolded (or unrolled). The term "unfolded" means that the network is written out or illustrated for the complete or entire sequence including all nodes NA, NB, and NC. For example, if the sequence of interest is a sentence of 3 words, the RNN may be unfolded into a 3-layer neural network, one layer for each word (e.g., without recurrent connections or without cycles).

In the RNN in FIG. 20, X represents an input of the RNN. For example, $X_t$ may be an input at time step t, and $X_{t-1}$ and $X_{t+1}$ may be inputs at time operations t−1 and t+1, respectively.

In the RNN in FIG. 20, S represents a hidden state. For example, $S_t$ may be a hidden state at the time step t, and $S_{t-1}$ and $S_{t+1}$ may be hidden states at the time operations t−1 and t+1, respectively. The hidden state may be calculated based on a previous hidden state and an input at a current step. For example, $S_t=f(UX_t+WS_{t-1})$. For example, the function f may be a nonlinearity function such as tanh or RELU. $S_{-1}$, which is used to calculate a first hidden state, may be typically initialized to all zeroes.

In the RNN in FIG. 20, O represents an output of the RNN. For example, $O_t$ may be an output at the time step t, and $O_{t-1}$ and $O_{t+1}$ may be outputs at the time operations t−1 and t+1, respectively. For example, if it is desired to predict a next word in a sentence, it would be a vector of probabilities across a vocabulary. For example, $O_t$=softmax($VS_t$).

In the RNN in FIG. 20, the hidden state may be a "memory" of the network. Thus, the RNN may have a "memory" which captures information about what has been calculated so far. The hidden state $S_t$ may capture information about what happened in all the previous time steps. The output $O_t$ may be calculated solely based on the memory at the current time step t. In addition, unlike a traditional neural network, which uses different parameters at each layer, the RNN may share the same parameters (e.g., U, V, and W in FIG. 20) across all time steps. This may represent the fact that the same task may be performed at each step, just with different inputs. This may greatly reduce the total number of parameters to be trained or learned.

In the method according to example embodiments, at least one cell count information is used for one memory block to measure the change in the distribution of the threshold voltages, and such information should be continuous (or cumulative). If two or more cell count information are obtained at a specific time point, the change in the distribution of the threshold voltages may be accurately measured. In addition, the shorter the period of obtaining the cell count information, the faster the change in the distribution of the threshold voltages may be detected. However, since the additional read operation is used to obtain the cell count information, the cell count information should be minimally collected within a range that does not affect the performance, and the period of obtaining the cell count information should be appropriately set. Further, the read voltage should be appropriately set to efficiently detect the change in the distribution of the threshold voltages.

Figure 21:
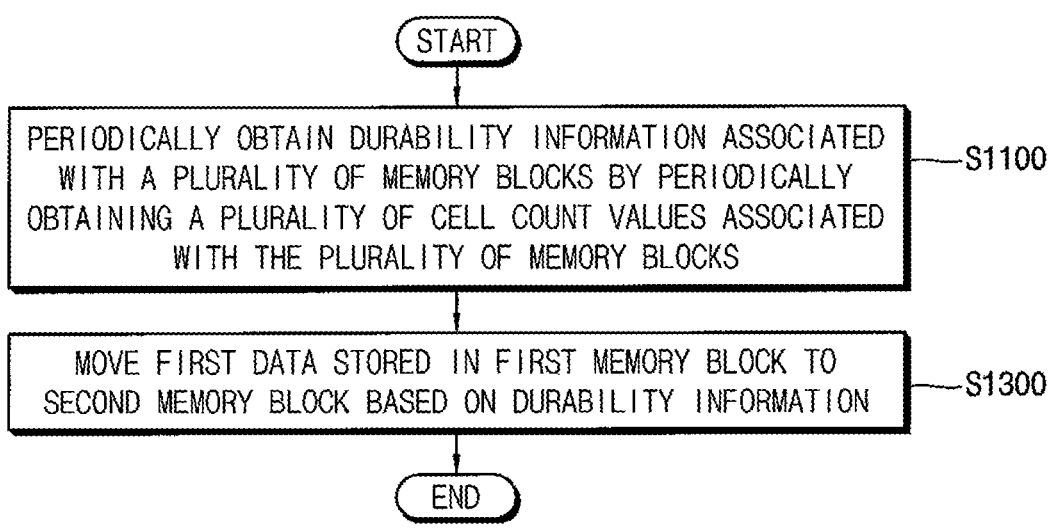
FIG. 21 is a flowchart illustrating a method of performing wear-leveling in a storage device according to example embodiments.

FIG. 21 is a flowchart illustrating a method of performing wear-leveling in a storage device according to example embodiments.

Referring to FIG. 21, a method of performing wear-leveling in a storage device according to example embodiments is performed by a storage device that includes a storage controller and a plurality of nonvolatile memory devices. Each of the plurality of nonvolatile memory devices includes a plurality of memory blocks. Detailed configurations of the storage device and a storage system including the storage device will be described further with reference to FIG. 22.

In the method of performing wear-leveling in the storage device according to example embodiments, durability information associated with a plurality of memory blocks is periodically obtained by periodically obtaining a plurality of cell count values associated with the plurality of memory blocks (operation S1100). For example, durability information associated with a first memory block among the plurality of memory blocks is periodically obtained by periodically obtaining at least one cell count value associated with the first memory block. Operation S1100 may be performed based on the method of measuring durability of the nonvolatile memory device according to example embodiments described with reference to FIGS. 1 through 20.

First data stored in the first memory block among the plurality of memory blocks is moved to a second memory block based on the durability information (operation S1300). Operation S1300 will be described further with reference to FIG. 23.

In the method of performing wear-leveling in the storage device according to example embodiments, the cell count values associated with each memory block may be periodically obtained, and the durability value associated with each memory block may be generated by accumulating the cell count values. In addition, a relatively large number of write operations may be assigned or allocated to a memory block having high durability based on the durability value. Accordingly, the storage device may have relatively long or improved lifetime.

FIG. 22 is a block diagram illustrating a storage device and a storage system including the storage device according to example embodiments.

Referring to FIG. 22, a storage system 500 may include a host device 600 and a storage device 700.

The host device 600 may control overall operations of the storage system 500. Although not illustrated in FIG. 22, the host device 600 may include a host processor and a host memory. The host processor may control an operation of the host device 600. For example, the host processor may execute an operating system (OS). The host memory may store instructions and/or data that are executed and/or processed by the host processor. For example, the operating system executed by the host processor may include a file system for file management and a device driver for controlling peripheral devices including the storage device 700 at the operating system level.

The storage device 700 may be accessed by the host device 600. The storage device 700 may include a storage controller 710, a plurality of nonvolatile memories (NVMs) 720a, 720b, and 720c, and a buffer memory 730.

The storage controller 710 may control an operation of the storage device 700 and/or operations of the plurality of nonvolatile memories 720a, 720b, and 720c based on a command and data that are received from the host device 600. The plurality of nonvolatile memories 720a, 720b, and 720c may store a plurality of data. For example, the plurality of nonvolatile memories 720a, 720b, and 720c may store meta data, various user data, or the like. The buffer memory 730 may store instructions and/or data that are executed and/or processed by the storage controller 710, and may temporarily store data stored in or to be stored into the plurality of nonvolatile memories 720a, 720b, and 720c. The memory system 10 of FIG. 2 may be implemented in the form of the storage device 700. For example, the storage controller 710 and the nonvolatile memories 720a, 720b, and 720c may correspond to the memory controller 20 and the nonvolatile memory device 40 in FIG. 2, respectively.

A durability manager (DM) 712 and an NPU 714 included in the storage controller 710 may correspond to the durability manager 430 and the NPU 432 in FIGS. 6 and 19, respectively. In an example embodiment, the NPU 714 may be omitted or disposed outside the storage controller 710.

In an example embodiment, the storage device 700 may be a solid state drive (SSD), a universal flash storage (UFS), a multi-media card (MMC), or an embedded multi-media card (eMMC). In other example embodiments, the storage device 700 may be one of a secure digital (SD) card, a micro SD card, a memory stick, a chip card, a universal serial bus (USB) card, a smart card, a compact flash (CF) card, or the like.

Figure 23:
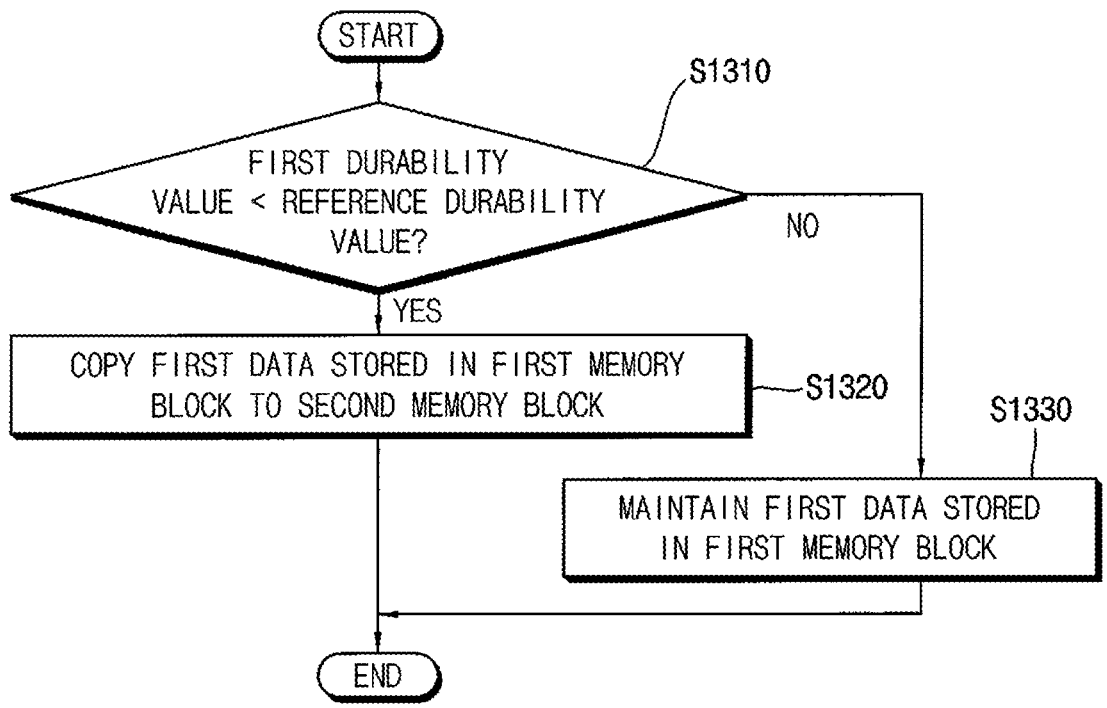
FIG. 23 is a flowchart illustrating an example of moving first data stored in a first memory block to a second memory block in FIG. 21.

FIG. 23 is a flowchart illustrating an example of moving first data stored in a first memory block to a second memory block in FIG. 21.

Referring to FIGS. 21 and 23, in an operation corresponding to operation S1300 of FIG. 21, a first durability value associated with the first memory block may be compared with a reference durability value (operation S1310 of FIG. 23). When the first durability value is less than the reference durability value (operation S1310: YES), it may be determined that the first memory block is a block that can no longer be used, and the first data stored in the first memory block may be copied to the second memory block (operation S1320 of FIG. 23). When the first durability value is greater than or equal to the reference durability value (operation S1310: NO), the first data stored in the first memory block may be maintained (operation S1330 of FIG. 23).

Figure 24:
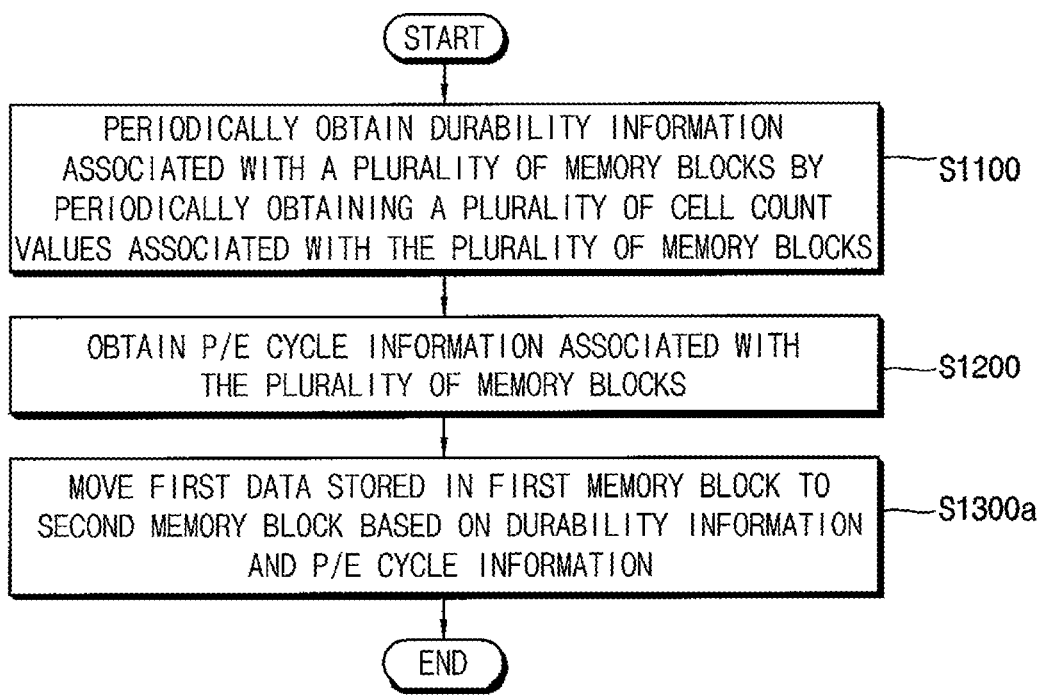
FIG. 24 is a flowchart illustrating a method of performing wear-leveling in a storage device according to example embodiments.

FIG. 24 is a flowchart illustrating a method of performing wear-leveling in a storage device according to example embodiments. The descriptions repeated with respect to FIG. 21 will be omitted.

Referring to FIG. 24, in a method of performing wear-leveling in a storage device according to example embodiments, operation S1100 may be substantially the same as operation S1100 in FIG. 21.

Program/erase (P/E) cycle information associated with the plurality of memory blocks may be obtained (operation S1200). For example, P/E cycle information associated with the first memory block may be obtained. The first data stored in the first memory block may be moved to the second memory block based on the durability information and the P/E cycle information (operation S1300a). Thus, the wear-leveling may be performed using both the durability information and the P/E cycle information.

Example embodiments may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 25:
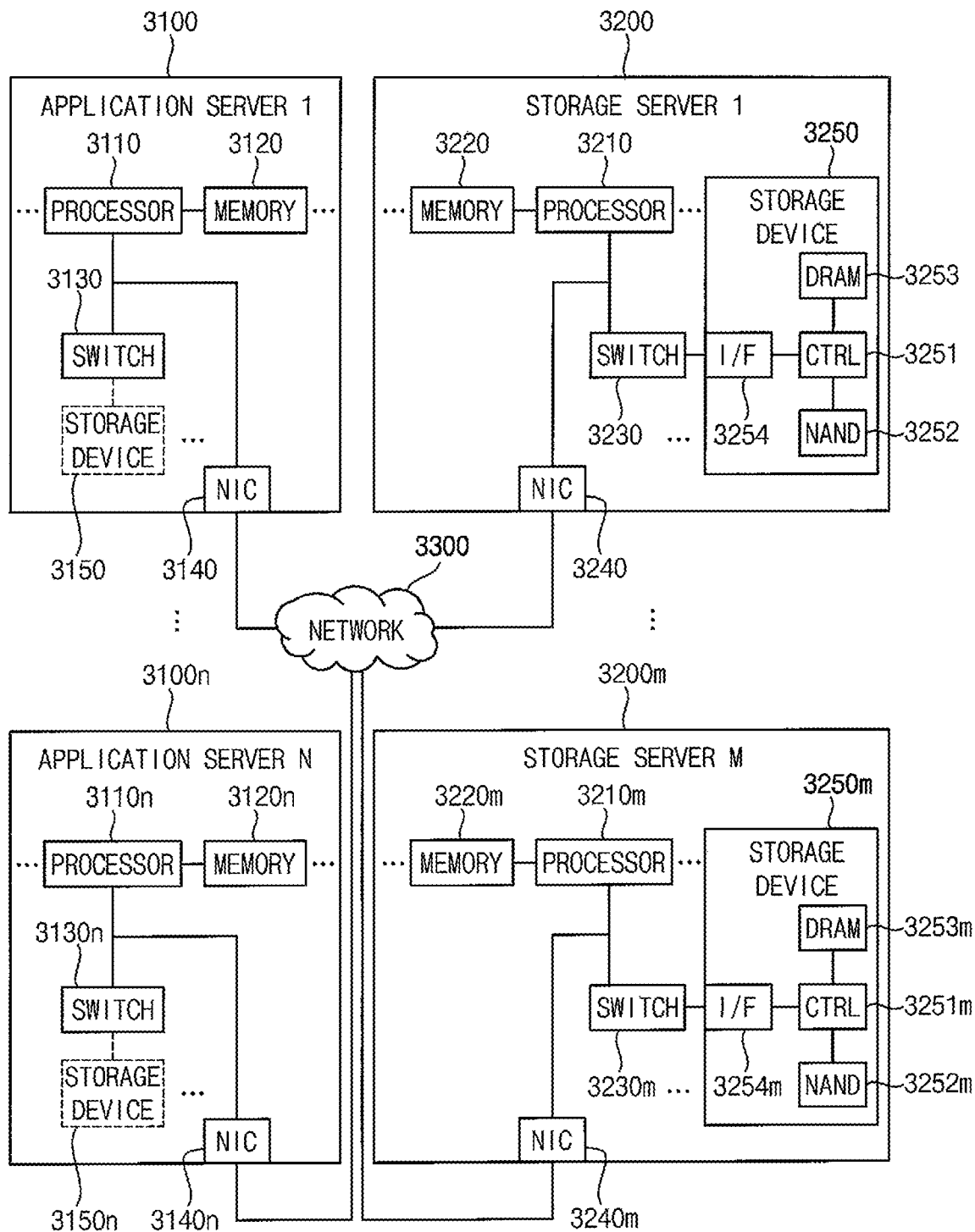
FIG. 25 is a block diagram illustrating a data center including a storage system according to example embodiments.

FIG. 25 is a block diagram illustrating a data center including a storage system according to example embodiments.

Referring to FIG. 25, a data center 3000 may be a facility that collects various types of data and provides various services, and may be referred to as a data storage center. The data center 3000 may be a system for operating search engines and databases, and may be a computing system used by companies such as banks or government agencies. The data center 3000 may include application servers 3100 to 3100n and storage servers 3200 to 3200m. The number of the application servers 3100 to 3100n and the number of the storage servers 3200 to 3200m may be variously selected according to example embodiments, and the number of the application servers 3100 to 3100n and the number of the storage servers 3200 to 3200m may be different from each other.

The application server 3100 may include at least one processor 3110 and at least one memory 3120, and the storage server 3200 may include at least one processor 3210 and at least one memory 3220. An operation of the storage server 3200 will be described as an example. The processor 3210 may control overall operations of the storage server 3200, and may access the memory 3220 to execute instructions and/or data loaded in the memory 3220. The memory 3220 may include at least one of a double data rate (DDR) synchronous dynamic random access memory (SDRAM), a high bandwidth memory (HBM), a hybrid memory cube (HMC), a dual in-line memory module (MINIM), an Optane MINIM, a nonvolatile DIMM (NVDIMM), etc. The number of the processors 3210 and the number of the memories 3220 included in the storage server 3200 may be variously selected according to example embodiments. In an example embodiment, the processor 3210 and the memory 3220 may provide a processor-memory pair. In an example embodiment, the number of the processors 3210 and the number of the memories 3220 may be different from each other. The processor 3210 may include a single core processor or a multiple core processor. The above description of the storage server 3200 may be similarly applied to the application server 3100. The application server 3100 may include at least one storage device 3150, and the storage server 3200 may include at least one storage device 3250. In an example embodiment, the application server 3100 may not include the storage device 3150. The number of the storage devices 3250 included in the storage server 3200 may be variously selected according to example embodiments.

The application servers 3100 to 3100n and the storage servers 3200 to 3200m may communicate with each other through a network 3300. The network 3300 may be implemented using a fiber channel (FC) or an Ethernet. The FC may be a medium used for a relatively high speed data transmission, and an optical switch that provides high performance and/or high availability may be used. The storage servers 3200 to 3200m may be provided as file storages, block storages, or object storages according to an access scheme of the network 3300.

In an example embodiment, the network 3300 may be a storage-only network or a network dedicated to a storage such as a storage area network (SAN). For example, the SAN may be an FC-SAN that uses an FC network and is implemented according to an FC protocol (FCP). For another example, the SAN may be an IP-SAN that uses a transmission control protocol/internet protocol (TCP/IP) network and is implemented according to an iSCSI (a SCSI over TCP/IP or an Internet SCSI) protocol. In other example embodiments, the network 3300 may be a general or normal network such as the TCP/IP network. For example, the network 3300 may be implemented according to at least one of protocols such as an FC over Ethernet (FCoE), a network attached storage (NAS), a nonvolatile memory express (NVMe) over Fabrics (NVMe-oF), etc.

Hereinafter, example embodiments will be described based on the application server 3100 and the storage server 3200. The description of the application server 3100 may be applied to the other application server 3100n, and the description of the storage server 3200 may be applied to the other storage server 3200m.

The application server 3100 may store data requested to be stored by a user or a client into one of the storage servers 3200 to 3200m through the network 3300. In addition, the application server 3100 may obtain data requested to be read by the user or the client from one of the storage servers 3200 to 3200m through the network 3300. For example, the application server 3100 may be implemented as a web server or a database management system (DBMS).

The application server 3100 may access a memory 3120n or a storage device 3150n included in the other application server 3100n through the network 3300, and/or may access the memories 3220 to 3220m or the storage devices 3250 to 3250m included in the storage servers 3200 to 3200m through the network 3300. Thus, the application server 3100 may perform various operations on data stored in the application servers 3100 to 3100n and/or the storage servers 3200 to 3200m. For example, the application server 3100 may execute a command for moving or copying data between the application servers 3100 to 3100n and/or the storage servers 3200 to 3200m. The data may be transferred from the storage devices 3250 to 3250m of the storage servers 3200 to 3200m to the memories 3120 to 3120n of the application servers 3100 to 3100n directly or through the memories 3220 to 3220m of the storage servers 3200 to 3200m. For example, the data transferred through the network 3300 may be encrypted data for security or privacy.

In the storage server 3200, an interface 3254 may provide a physical connection between the processor 3210 and a controller 3251 and/or a physical connection between a network interface card (NIC) 3240 and the controller 3251. For example, the interface 3254 may be implemented based on a direct attached storage (DAS) scheme in which the storage device 3250 is directly connected with a dedicated cable. For example, the interface 3254 may be implemented based on at least one of various interface schemes such as an advanced technology attachment (ATA), a serial ATA (SATA) an external SATA (e-SATA), a small computer system interface (SCSI), a serial attached SCSI (SAS), a peripheral component interconnection (PCI), a PCI express (PCIe), an NVMe, an IEEE 1394, a universal serial bus (USB), a secure digital (SD) card interface, a multi-media card (MMC) interface, an embedded MMC (eMMC) interface, a universal flash storage (UFS) interface, an embedded UFS (eUFS) interface, a compact flash (CF) card interface, etc.

The storage server 3200 may include a switch 3230 and the NIC 3240. The switch 3230 may selectively connect the processor 3210 with the storage device 3250, or may selectively connect the NIC 3240 with the storage device 3250 under a control of the processor 3210. Similarly, the application server 3100 may include a switch 3130 and a NIC 3140.

In an example embodiment, the NIC 3240 may include a network interface card, a network adapter, or the like. The NIC 3240 may be connected to the network 3300 through a wired interface, a wireless interface, a Bluetooth interface, an optical interface, or the like. The NIC 3240 may include an internal memory, a digital signal processor (DSP), a host bus interface, or the like, and may be connected to the processor 3210 and/or the switch 3230 through the host bus interface. The host bus interface may be implemented as one of the above-described examples of the interface 3254. In an example embodiment, the NIC 3240 may be integrated with at least one of the processor 3210, the switch 3230 and the storage device 3250.

In the storage servers 3200 to 3200m and/or the application servers 3100 to 3100n, the processor may transmit a command to the storage devices 3150 to 3150n and 3250 to 3250m or the memories 3120 to 3120n and 3220 to 3220m to program or read data. For example, the data may be error-corrected data by an error correction code (ECC) engine. For example, the data may be processed by a data bus inversion (DBI) or a data masking (DM), and may include a cyclic redundancy code (CRC) information. For example, the data may be encrypted data for security or privacy.

The storage devices 3150 to 3150m and 3250 to 3250m may transmit a control signal and command/address signals to NAND flash memory devices 3252 to 3252m in response to a read command received from the processor. When data is read from the NAND flash memory devices 3252 to 3252m, a read enable (RE) signal may be input as a data output control signal and may serve to output data to a DQ bus. A data strobe signal (DQS) may be generated using the RE signal. The command and address signals may be latched in a page buffer based on a rising edge or a falling edge of a write enable (WE) signal.

The controller 3251 may control overall operations of the storage device 3250. In an example embodiment, the controller 3251 may include a static random access memory (SRAM). The controller 3251 may write data into the NAND flash memory device 3252 in response to a write command, or may read data from the NAND flash memory device 3252 in response to a read command. For example, the write command and/or the read command may be provided from the processor 3210 in the storage server 3200, the processor 3210m in the other storage server 3200m, or the processors 3110 to 3110n in the application servers 3100 to 3100n. A DRAM 3253 may temporarily store (e.g., may buffer) data to be written to the NAND flash memory device 3252 or data read from the NAND flash memory device 3252. Further, the DRAM 3253 may store meta data. The meta data may be data generated by the controller 3251 to manage user data or the NAND flash memory device 3252.

The storage devices 3150 to 3150m and 3250 to 3250m may be implemented based on the nonvolatile memory device and the storage device according to example embodiments described with reference to FIGS. 1 through 24, and may be implemented to perform the method of measuring durability of the nonvolatile memory device and the method of performing wear-leveling according to example embodiments described with reference to FIGS. 1 through 24.

Example embodiments may be applied to various electronic devices and systems that include the nonvolatile memory devices and the storage devices. For example, example embodiments may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

By way of summation and review, semiconductor memory devices may deteriorate according to usage, environmental conditions, and other factors. Such deterioration may result in loss of stored data. To avoid such data loss, various ways have been developed to estimate and control the level of deterioration of a memory device, such as monitoring memory access operations and wear-leveling.

As described above, embodiments may provide a method of measuring durability of a nonvolatile memory device. The method may efficiently measure durability of a plurality of memory blocks included in the nonvolatile memory device.

Embodiments may also provide a method of performing wear-leveling in a storage device using the method of measuring durability of the nonvolatile memory device.

In a method of measuring durability of the nonvolatile memory device according to an example embodiment, the cell count values associated with each memory block may be periodically obtained, and a durability value associated with each memory block may be generated by accumulating the cell count values. The durability value based on the cell count values may be obtained with a relatively low cost, and the durability of each memory block may be precisely and/or accurately represented by the durability value based on the cell count values. Accordingly, the durability and/or wear-level of the plurality of memory blocks may be efficiently checked, and thus the plurality of memory blocks may be efficiently managed.

In a method of performing wear-leveling in a storage device according to an example embodiment, a relatively large number of write operations may be assigned or allocated to a memory block having high durability based on the durability value. Accordingly, the storage device may have relatively long or improved lifetime.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of measuring durability of a nonvolatile memory device that includes a plurality of memory blocks, the method comprising:
   periodically receiving a read command for a first memory block among the plurality of memory blocks;
   periodically performing a read operation on first memory cells of the first memory block based on the read command, the first memory cells connected to a first wordline, the first wordline being determined in advance of the method of measuring durability;
   periodically outputting at least one cell count value associated with the first memory block based on a result of the read operation; and
   periodically storing durability information associated with the first memory block in response to a periodic reception of the durability information, the durability information being obtained by accumulating the at least one cell count value.

2. The method as claimed in claim 1, wherein periodically performing the read operation includes:
   at a first time point, performing a first read operation on the first memory cells among a plurality of memory cells included in the first memory block based on a first read voltage; and
   at a second time point at which a first time interval is elapsed from the first time point, performing a second read operation on the first memory cells based on the first read voltage.

3. The method as claimed in claim 2, wherein the first memory cells are connected to the first wordline among a plurality of wordlines connected to the first memory block.

4. The method as claimed in claim 3, wherein the first wordline is an edge wordline among the plurality of wordlines connected to the first memory block.

5. The method as claimed in claim 2, wherein periodically outputting the at least one cell count value includes:
   at the first time point, generating a first cell count value associated with the first memory cells based on a result of the first read operation, to output the first cell count value; and
   at the second time point, generating a second cell count value associated with the first memory cells based on a result of the second read operation, to output the second cell count value.

6. The method as claimed in claim 5, wherein the first cell count value represents a number of on-cells among the first memory cells at the first time point.

7. The method as claimed in claim 6, wherein the on-cells represent memory cells having a threshold voltage lower than the first read voltage among the first memory cells.

8. The method as claimed in claim 5, wherein periodically storing the durability information includes:
   obtaining a first durability value associated with the first memory block based on the first cell count value and the second cell count value; and
   storing the first durability value in response to a reception of the first durability value.

9. The method as claimed in claim 8, wherein:
   the first durability value corresponds to a change in a number of on-cells among the first memory cells,
   it is determined that the first memory block has high durability as the first durability value increases, and
   it is determined that the first memory block has low durability as the first durability value decreases.

10. The method as claimed in claim 8, wherein periodically performing the read operation further includes:
    at a third time point at which the first time interval is elapsed from the second time point, performing a third read operation on the first memory cells based on the first read voltage.

11. The method as claimed in claim 10, wherein periodically outputting the at least one cell count value further includes:
    at the third time point, generating a third cell count value associated with the first memory cells based on a result of the third read operation, to output the third cell count value.

12. The method as claimed in claim 11, wherein periodically storing the durability information further includes:

updating the first durability value associated with the first memory block based on the first cell count value, the second cell count value, and the third cell count value; and storing an updated first durability value in response to a reception of the updated first durability value.

13. The method as claimed in claim 8, wherein periodically performing the read operation further includes:

at the first time point, performing a third read operation on the first memory cells based on a second read voltage different from the first read voltage; and at the second time point, performing a fourth read operation on the first memory cells based on the second read voltage.

14. The method as claimed in claim 13, wherein periodically outputting the at least one cell count value further includes:

at the first time point, generating a third cell count value associated with the first memory cells based on a result of the third read operation, to output the third cell count value; and at the second time point, generating a fourth cell count value associated with the first memory cells based on a result of the fourth read operation, to output the fourth cell count value.

15. The method as claimed in claim 14, wherein:

the first durability value at the first time point is obtained based on the first cell count value and the third cell count value, and the first durability value at the second time point is updated based on the second cell count value, the fourth cell count value, and the first durability value at the first time point.

16. The method as claimed in claim 15, wherein the first durability value is obtained using a recurrent neural network (RNN).

17. A method of performing wear-leveling in a storage device that includes a storage controller and a plurality of nonvolatile memory devices, each of the plurality of nonvolatile memory devices including a plurality of memory blocks, the method comprising:

periodically obtaining durability information associated with a first memory block among the plurality of memory blocks by periodically obtaining at least one cell count value associated with the first memory block; and moving first data stored in the first memory block to a second memory block based on the durability information, wherein periodically obtaining the durability information includes:

periodically providing, by the storage controller, a read command for the first memory block;

periodically performing a read operation on first memory cells of the first memory block based on the read command, the first memory cells connected to a first wordline, the first wordline being determined in advance of the method of performing wear-leveling in a storage device;

periodically providing, by the plurality of nonvolatile memory devices, the at least one cell count value based on a result of the read operation; and periodically providing, by the storage controller, the durability information, the durability information being obtained by accumulating the at least one cell count value.

18. The method as claimed in claim 17, wherein moving the first data stored in the first memory block to the second memory block includes:

comparing a first durability value associated with the first memory block with a reference durability value; and when the first durability value is less than the reference durability value, copying the first data stored in the first memory block to the second memory block.

19. The method as claimed in claim 17, further comprising:

obtaining program/erase (P/E) cycle information associated with the first memory block, and wherein the first data stored in the first memory block is moved to the second memory block based on the durability information and the P/E cycle information.

20. A method of measuring durability of a nonvolatile memory device that includes a plurality of memory blocks, the method comprising:

at a first time point, receiving a first read command for a first memory block among the plurality of memory blocks;

at the first time point, performing a first read operation on first memory cells among a plurality of memory cells included in the first memory block based on a first read voltage, the first memory cells connected to a first wordline, the first wordline being determined in advance of the method of measuring durability of a nonvolatile memory device;

at the first time point, generating a first cell count value associated with the first memory cells based on a result of the first read operation to output the first cell count value;

at a second time point at which a first time interval is elapsed from the first time point, receiving a second read command for the first memory block;

at the second time point, performing a second read operation on the first memory cells based on the first read voltage;

at the second time point, generating a second cell count value associated with the first memory cells based on a result of the second read operation to output the second cell count value;

obtaining a first durability value associated with the first memory block based on the first cell count value and the second cell count value; and storing the first durability value in response to a reception of the first durability value, wherein the first durability value corresponds to a change in a number of on-cells among the first memory cells, and the on-cells represent memory cells having a threshold voltage lower than the first read voltage among the first memory cells.

* * * * *